United States Patent
Endo et al.

(10) Patent No.: US 12,077,633 B2
(45) Date of Patent: Sep. 3, 2024

(54) CHEMICAL-RESISTANT PROTECTIVE FILM-FORMING COMPOSITION CONTAINING POLYMERIZATION PRODUCT OF ARYLENE COMPOUND HAVING GLYCIDYL GROUP

(71) Applicant: NISSAN CHEMICAL CORPORATION, Tokyo (JP)

(72) Inventors: Takafumi Endo, Toyama (JP); Tokio Nishita, Toyama (JP); Ryuta Mizuochi, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 731 days.

(21) Appl. No.: 17/279,299

(22) PCT Filed: Oct. 31, 2019

(86) PCT No.: PCT/JP2019/042708
§ 371 (c)(1),
(2) Date: Mar. 24, 2021

(87) PCT Pub. No.: WO2020/090950
PCT Pub. Date: May 7, 2020

(65) Prior Publication Data
US 2021/0403635 A1    Dec. 30, 2021

(30) Foreign Application Priority Data
Nov. 1, 2018 (JP) ................. 2018-206860

(51) Int. Cl.
| C08G 59/68 | (2006.01) |
| C08G 59/24 | (2006.01) |
| G03F 7/11 | (2006.01) |
| G03F 7/16 | (2006.01) |
| H01L 21/033 | (2006.01) |
| H01L 21/308 | (2006.01) |
| H01L 21/311 | (2006.01) |

(52) U.S. Cl.
CPC .......... *C08G 59/245* (2013.01); *C08G 59/68* (2013.01); *G03F 7/11* (2013.01); *G03F 7/168* (2013.01); *H01L 21/0337* (2013.01); *H01L 21/3081* (2013.01); *H01L 21/31111* (2013.01); *H01L 21/31144* (2013.01)

(58) Field of Classification Search
CPC ............. H01L 21/0337; H01L 21/3111; H01L 21/3081; H01L 21/31144; C08G 59/245; C08G 29/68; G03F 7/11; G03F 7/168
See application file for complete search history.

(56) References Cited

U.S. PATENT DOCUMENTS

| 2008/0268379 A1 | 10/2008 | Sakamoto |
| 2009/0317740 A1 | 12/2009 | Hiroi et al. |
| 2019/0088501 A1 | 3/2019 | Inoue et al. |
| 2019/0177475 A1 | 6/2019 | Ogata et al. |
| 2020/0131376 A1 | 4/2020 | Tokunaga et al. |
| 2020/0183282 A1* | 6/2020 | Hashimoto ........... C08F 220/06 |
| 2020/0201184 A1 | 6/2020 | Ogata et al. |

FOREIGN PATENT DOCUMENTS

| CN | 101160549 A | 4/2008 |
| CN | 101473270 A | 7/2009 |
| CN | 108713164 A | 10/2018 |
| WO | 2017/158930 A1 | 9/2017 |
| WO | 2018/052130 A1 | 3/2018 |
| WO | 2018/203464 A1 | 11/2018 |
| WO | 2018/203540 A1 | 11/2018 |

OTHER PUBLICATIONS

Apr. 27, 2021 International Preliminary Report on Patentability issued in International Patent Application No. PCT/JP2019/042708.
Jan. 28, 2020 International Search Report issued in International Patent Application No. PCT/JP2019/042708.
Feb. 15, 2023 Office Action issued in Chinese Patent Application No. 201980071835.7.

\* cited by examiner

*Primary Examiner* — Robert D Harlan
(74) *Attorney, Agent, or Firm* — Oliff PLC

(57) ABSTRACT

A protective film forming composition forms a flat film having good mask function against a wet etching liquid during a semiconductor substrate processing, high dry etching rate and good coverage of a substrate with level difference, while having small film thickness difference after embedding. A protective film is produced using this composition. A substrate has a resist pattern. A method produces a semiconductor device. A composition forms a protective film against a wet etching liquid for semiconductors, containing a solvent and a ring-opened polymer (C) obtained by reaction between a diepoxy compound (A) and a bi- or higher functional proton-generating compound (B). The ring-opened polymer (C) is preferably represented by a unit structure of formula (A-1). (In formula (A-1), Q represents a divalent organic group generated by the diepoxy compound (A) ring-opening polymerization; and T represents a divalent organic group derived from the bi- or higher functional proton-generating compound (B)).

20 Claims, No Drawings

CHEMICAL-RESISTANT PROTECTIVE FILM-FORMING COMPOSITION CONTAINING POLYMERIZATION PRODUCT OF ARYLENE COMPOUND HAVING GLYCIDYL GROUP

TECHNICAL FIELD

The present invention relates to a composition for forming a protective film, in particular, excellent in resistance to a wet etching liquid for semiconductors, in a lithography process for the manufacture of semiconductors. Also, it relates to a method for producing a substrate with a resist pattern using the above-mentioned protective film, and a method for manufacturing semiconductor devices.

BACKGROUND ART

In the manufacture of semiconductors, a lithography process in which a resist underlayer film is provided between a substrate and a resist film to be formed thereon, and a resist pattern with a desired shape is formed has widely be known. Processing of the substrate is carried out after formation of the resist pattern. Although dry etching is mainly used for the process, wet etching is used in some cases depending on the type of the substrate. Patent Literature 1 discloses a protective film-forming composition to an aqueous hydrogen peroxide solution, containing a specific compound which contains a carboxy group and/or a hydroxy group.

CITATION LIST

Patent Literature

Patent Literature 1: WO 2018/052130A

SUMMARY OF INVENTION

Technical Problem

When a resist underlayer film is used as an etching mask and a processing of a base substrate is carried out by wet etching, the resist underlayer film is required to have a good mask function to the wet etching liquid (that is, capability of protecting the substrate at the masked portion from the liquid) at the time of processing the base substrate. In such a case, the resist underlayer film is used as a protective film to the substrate. Further, when unnecessary protective film is removed by dry etching after the wet etching, the protective film is required to be a (high etching rate) protective film having a high etching rate so as to be quickly removed by dry etching so that no damage of the base substrate is caused.

Moreover, it has been also demanded for a protective film-forming composition which has good covering property to a so-called stepped substrate, has a small difference in the film thickness after embedding, and can form a flat film.

Heretofore, in order to develop resistance to SC-1 (ammonia-hydrogen peroxide solution) which is a kind of wet etching chemical liquid, a method of applying a low molecule compound (for example, gallic acid) as an additive has been used, but there was a limit to solve the above-mentioned problems.

An object of the present invention is to solve the above-mentioned problems.

Solution to Problem

The present invention embraces the following.

[1]
A protective film-forming composition to a wet etching liquid for semiconductors, which comprises a solvent and a ring-opening polymerization product (C) from a reaction of a diepoxy compound (A) and a bi- or higher functional proton-generating compound (B).

[2]
The protective film-forming composition according to [1], wherein the ring-opening polymerization product (C) is represented by a unit structure of the following formula (A-1):

[Formula 1]

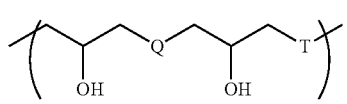

Formula(A-1)

wherein, in formula (A-1), Q represents a divalent organic group from the ring-opening polymerization of the diepoxy compound (A), and T represents a divalent organic group derived from the bi- or higher functional proton-generating compound (B).

[3]
The protective film-forming composition according to [2], wherein Q in formula (A-1) is represented by the following formula (A-2):

[Formula 2]

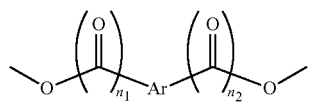

Formula (A-2)

wherein, in formula (A-2), Ar represents a divalent arylene group, and $n_1$ and $n_2$ each independently represent an integer of 0 or 1.

[4]
The protective film-forming composition according to [3], wherein Ar in formula (A-2) is represented by any of the following formula (A-3), the following formula (A-4) and the following formula (A-5):

[Formula 3]

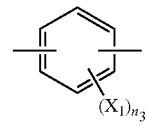

Formula(A-3)

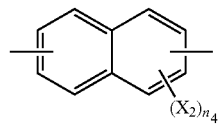

Formula(A-4)

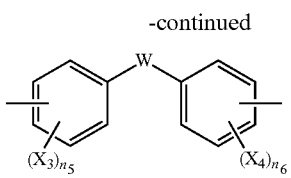
Formula(A-5)

wherein, in formula (A-3) to formula (A-5), $X_1$, $X_2$, $X_3$ and $X_4$ each independently represent an alkyl group having 1 to 6 carbon atoms; —W— represents any of a direct bond, —CH$_2$—, —C(CH$_3$)$_2$—, —C(CF$_3$)$_2$, —CO—, —O—, —S— or —SO$_2$—; $n_3$, $n_3$ and $n_6$ each independently represent an integer of 0 to 4; and $n_4$ represents an integer of 0 to 6.

[5]
The protective film-forming composition according to [1], wherein T in formula (A-1) is represented by the following formula (A-6) or the following formula (A-7):

[Formula 4]

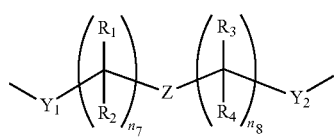
Formula(A-6)

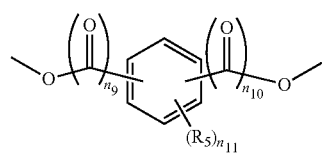
Formula(A-7)

wherein, in formula (A-6) or formula (A-7), $R_1$, $R_2$, $R_3$, $R_4$ and $R_5$ each independently represent a hydrogen atom, an alkyl group having 1 to 6 carbon atoms optionally substituted, an alkenyl group having 2 to 6 carbon atoms, a hydroxy group, an alkoxy group having 1 to 6 carbon atoms, a cyano group or a halogen atom, and $R_2$ and $R_4$ optionally bonded to each other to form a ring; —Y$_1$— and —Y$_2$— each independently represent —O—, —S—, —COO— or —COO—; Z represents a direct bond or a divalent organic group; $n_7$ and $n_8$ each independently represent an integer of 0 to 5; $n_9$ and $n_{10}$ each independently represent an integer of 0 or 1; and $n_{11}$ represents an integer of 0 to 4.

[6]
The protective film-forming composition according to [5], wherein the divalent organic group represented by Z in formula (A-6) is represented by the following formula (A-8):

[Formula 5]

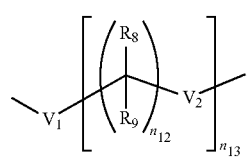
Formula(A-8)

wherein, in formula (A-8), —V$_1$— represents —O—, —S—, —S—S—, —CR$_{10}$=CR$_{11}$—, —C(=CR$_{12}$R$_{13}$)— or —C≡C—; $R_{10}$, $R_{11}$, $R_{12}$ and $R_{13}$ each independently represent a hydrogen atom or a methyl group: —V$_2$— represents —O— or —S—; $R_8$ and $R_9$ each independently represent a hydrogen atom, an alkyl group having 1 to 6 carbon atoms optionally substituted, an alkenyl group having 2 to 6 carbon atoms, a hydroxy group, an alkoxy group having 1 to 6 carbon atoms, a cyano group or a halogen atom; $n_{12}$ represents an integer of 1 to 3; and $n_{13}$ represents an integer of 0 to 2.

[7]
The protective film-forming composition according to [4], wherein Ar in formula (A-2) is represented by formula (A-3).

[8]
The protective film-forming composition according to [7], wherein $n_3$ in formula (A-3) is 0.

[9]
The protective film-forming composition according to [5], wherein -T- in formula (A-1) is represented by formula (A-6).

[10]
The protective film-forming composition according to [9], wherein —Y$_1$— and —Y$_2$— in formula (A-6) are —COO—.

[11]
The protective film-forming composition according to any one of [1] to [10], which further comprises a cross-linking catalyst.

[12]
The protective film-forming composition according to any one of [1] to [11], which further comprises a cross-linking agent.

[13]
The protective film-forming composition according to any one of [1] to [12], which further comprises a surfactant.

[14]
A protective film which comprises a baked product of an applied film comprising the protective film-forming composition according to any one of [1] to [13].

[15]
A method for producing a substrate equipped with a resist pattern characterized by being used for manufacturing a semiconductor, which comprises the steps of:
applying the protective film composition according to any one of [1] to [13] on a semiconductor substrate and baking the applied composition to form a protective film as a resist underlayer film, and
forming a resist film on the protective film, followed by subjecting the resist and protective films to exposure and development to form a resist pattern.

[16]
A method for manufacturing a semiconductor device which comprises the steps of:
forming a protective film on a semiconductor substrate optionally carrying an inorganic film formed thereon with the protective film-forming composition according to any one of [1] to [13],
forming a resist pattern on the protective film,
dry etching the protective film using the resist pattern as a mask to expose a surface of the inorganic film or the semiconductor substrate, and
wet etching the inorganic film or the semiconductor substrate with a wet etching liquid for semiconductors using the dry-etched protective film as a mask, followed by washing the wet-etched inorganic film and substrate.

Advantageous Effects of Invention

The protective film-forming composition of the present invention has a good mask function to a wet etching liquid at the time of processing a base substrate, and further it is excellent in high dry etching rate and flatness of a stepped substrate, so that it enables fine processing of a semiconductor substrate easily.

DESCRIPTION OF EMBODIMENTS

Protective Film-Forming Composition

The protective film-forming composition of the present application contains a ring-opening polymerization product (C) from a reaction of a diepoxy compound (A) and a bi- or higher functional proton-generating compound (B).

The ring-opening polymerization product (C), which is a resulting product of reacting the diepoxy compound (A) and the bi- or higher functional proton-generating compound (B) by, for example, the method known per se described in Examples, preferably has the unit structure below.

[Formula 6]

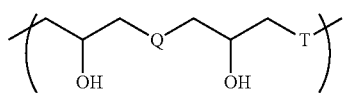

Formula (A-1)

wherein, in formula (A-1), Q represents a divalent organic group from the ring-opening polymerization of the diepoxy compound (A), and T represents a divalent organic group derived from the bi- or higher functional proton-generating compound (B).

In formula (A-1) above, Q is preferably represented by the following formula (A-2).

[Formula 7]

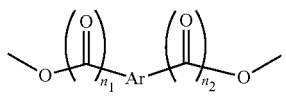

Formula(A-2)

wherein, in formula (A-2), Ar represents a divalent arylene group, and $n_1$ and $n_2$ each independently represent an integer of 0 or 1.

The above-mentioned Ar includes, for example, an arylene group having 6 to 40 carbon atoms. Specific examples thereof include a phenylene group, an o-methylphenylene group, a m-methylphenylene group, a p-methylphenylene group, an o-chlorophenylene group, a m-chlorophenylene group, a p-chlorophenylene group, an o-fluorophenylene group, a p-fluorophenylene group, an o-methoxyphenylene group, a p-methoxyphenylene group, a p-nitrophenylene group, a p-cyanophenylene group, an α-naphthylene group, a β-naphthylene group, an o-biphenylylene group, a m-biphenylylene group, a p-biphenylylene group, a 1-anthrylene group, a 2-anthrylene group, a 9-anthrylene group, a 1-phenanthrylene group, a 2-phenanthrylene group, a 3-phenanthrylene group, a 4-phenanthrylene group and a 9-phenanthrylene group. A part or whole of the hydrogen atom(s) possessed by the above-mentioned arylene group having 6 to 40 carbon atoms may be substituted by a substituent(s).

Or else, the above-mentioned Ar is preferably represented by any of the following formula (A-3), the following formula (A-4) and the following formula (A-5).

[Formula 8]

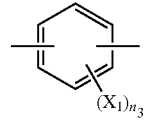

Formula(A-3)

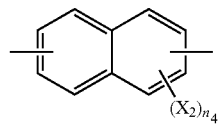

Formula(A-4)

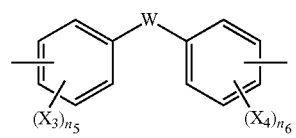

Formula(A-5)

wherein, in formula (A-3) to formula (A-5), $X_1$, $X_2$, $X_3$ and $X_4$ each independently represent an alkyl group having 1 to 6 carbon atoms; —W— represents any of a direct bond, —$CH_2$—, —$C(CH_3)_2$—, —$C(CF_3)_2$, —CO—, —O—, —S— or —$SO_2$—; $n_3$, $n_8$ and $n_6$ each independently represent an integer of 0 to 4; and $n_4$ represents an integer of 0 to 6.

The above-mentioned Ar in formula (A-3) to formula (A-5) is preferably represented by formula (A-3).

$n_3$ is preferably 0.

The above-mentioned alkyl group having 1 to 6 carbon atoms includes a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, etc.

In the above-mentioned formula (A-1), T is preferably represented by the following formula (A-6) or the following formula (A-7).

[Formula 9]

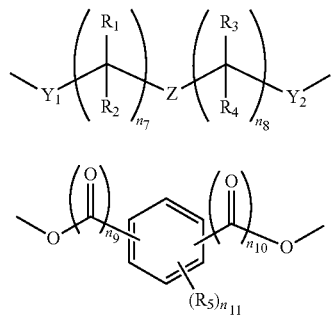

Formula (A-6)

Formula (A-7)

wherein, in formula (A-6) or formula (A-7), $R_1$, $R_2$, $R_3$, $R_4$ and $R_8$ each independently represent a hydrogen atom, an alkyl group having 1 to 6 carbon atoms optionally substituted, an alkenyl group having 2 to 6 carbon atoms, a hydroxy group, an alkoxy group having 1 to 6 carbon atoms, a cyano group or a halogen atom, and $R_2$ and $R_4$ optionally bonded to each other to form a ring; —$Y_1$— and —$Y_2$— each independently represent —O—, —S— or —COO—; —Z— represents a direct bond or a divalent organic group, and preferred divalent organic group represents —O—, —S—, —S—S—, —$CR_{10}$=$CR_{11}$—, —C(=$CR_{12}R_{13}$)— or —C≡C—; $R_{10}$, $R_{11}$, $R_{12}$ and $R_{13}$ each independently represent a hydrogen atom or a methyl group; $n_7$ and $n_8$ each independently represent an integer of 0 to 5; $n_9$ and $n_{10}$ each independently represent an integer of 0 or 1; and $n_{11}$ represents an integer of 0 to 4.

The alkyl group having 1 to 6 carbon atoms includes the above-mentioned alkyl groups.

The above-mentioned "optionally substituted" means that a part or all of the hydrogen atoms of the above-mentioned alkyl group may be substituted with, for example, a hydroxy group, a halogen atom, a carboxyl group, a nitro group, a cyano group, a methylenedioxy group, an acetoxy group, a methylthio group, an amino group or an alkoxy group having 1 to 9 carbon atoms.

The above-mentioned halogen atom includes a fluorine atom, a chlorine atom, a bromine atom and an iodine atom.

The above-mentioned alkenyl group having 2 to 6 carbon atoms includes an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, an 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 1-cyclohexenyl group, a 2-cyclohexenyl group, a 3-cyclohexenyl group and the like.

The above-mentioned alkoxy group having 1 to 6 carbon atoms includes a methoxy group, an ethoxy group, an n-propoxy group, an i-propoxy group, an n-butoxy group, an i-butoxy group, an s-butoxy group, an t-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group and the like.

The phrase "$R_2$ and $R_4$ optionally bonded to each other to form a ring" means that $R_2$ and $R_4$ may be bonded to each other to form, for example, a hydrocarbon ring having 3 to 12 carbon atoms.

In the above-mentioned formula (A-6), the divalent organic group represented by Z is preferably represented by the following formula (A-8).

[Formula 10]

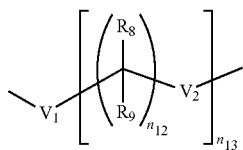

Formula(A-8)

wherein, in formula (A-8), —V$_1$— represents —O—, —S—, —S—S—, —CR$_{10}$=CR$_{11}$—, —C(=CR$_{12}$R$_{13}$)— or —C≡C—; R$_{10}$, R$_{11}$, R$_{12}$ and Ria each independently represent a hydrogen atom or a methyl group; —V$_2$— represents —O— or —S—; R$_8$ and R$_9$ each represent a hydrogen atom, an alkyl group having 1 to 6 carbon atoms optionally substituted, an alkenyl group having 2 to 6 carbon atoms, a hydroxy group, an alkoxy group having 1 to 6 carbon atoms, a cyano group or a halogen atom; n$_{12}$ represents an integer of 1 to 3; and n$_{13}$ represents an integer of 0 to 2.

Preferred specific examples of the alkyl group having 1 to 6 carbon atoms optionally substituted, the alkenyl group having 2 to 6 carbon atoms and the alkoxy group having 1 to 6 carbon atoms are as mentioned above.

In the above-mentioned formula (A-1), T is preferably represented by the following formula (A-6).

In the above-mentioned formula (A-6), the divalent organic group represented by Z is preferably represented by the following formula (A-8).

—Y$_1$— and —Y$_2$— in the above-mentioned formula (A-6) are preferably —COO—. The —COO— represents an ester bond. It is preferred that the carbonyl group of the ester bond is present at the position close to the unit structure containing the substituents R$_1$ and R$_2$ of formula (A-6) or to the unit structure containing the substituents R$_3$ and R$_4$.

The above-mentioned unit structure of the ring-opening polymerization product (C) may be exemplified, for example, as follows.

[Formula 11]

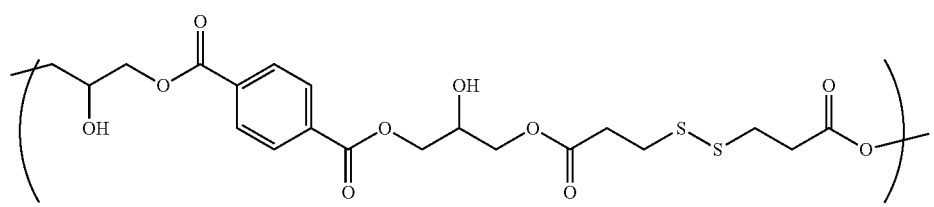

Formula(B-1)

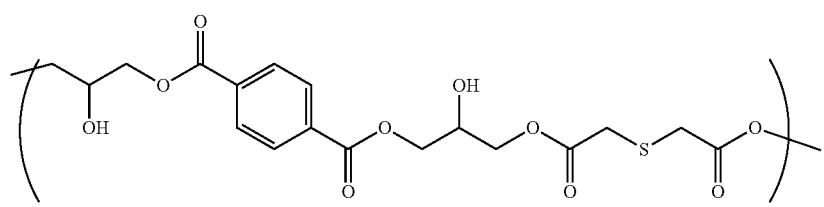

Formula(B-2)

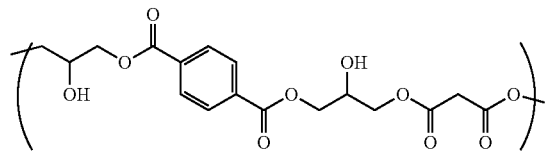

Formula(B-3)

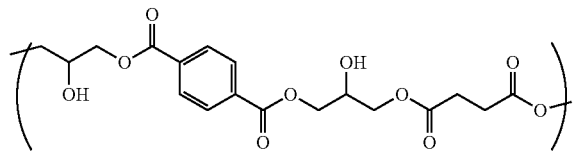

Formula(B-4)

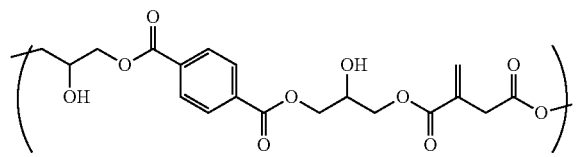

Formula(B-5)

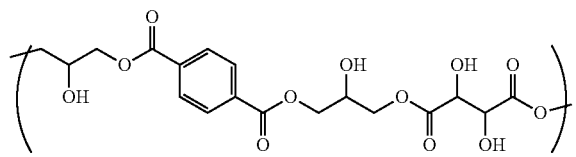

Formula(B-6)

[Formula 12]

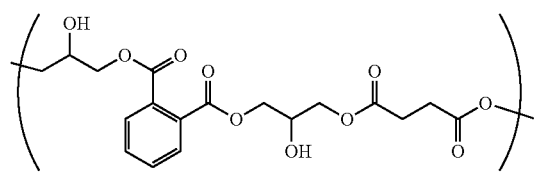

Formula(B-7)

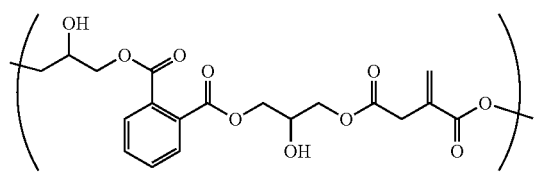

Formula(B-8)

Formula(B-9)
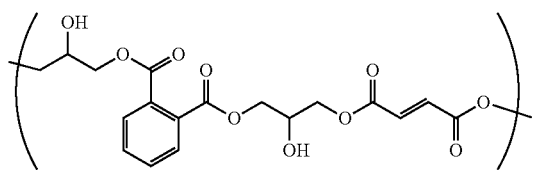
Formula(B-10)
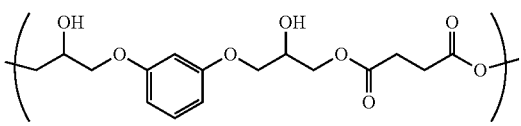
Formula(B11)
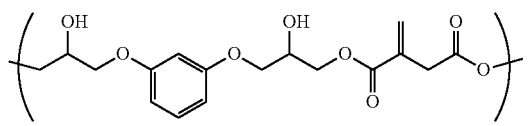
Formula(B-12)
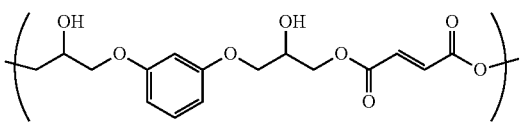
[Formula 13]
Formula(B-13)
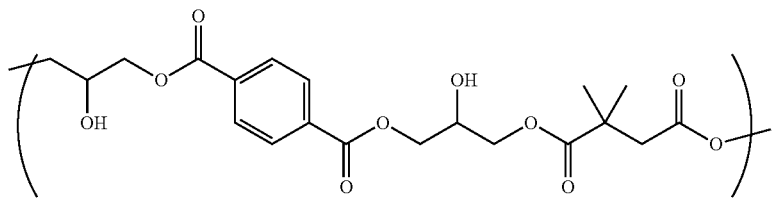
Formula(B-14)
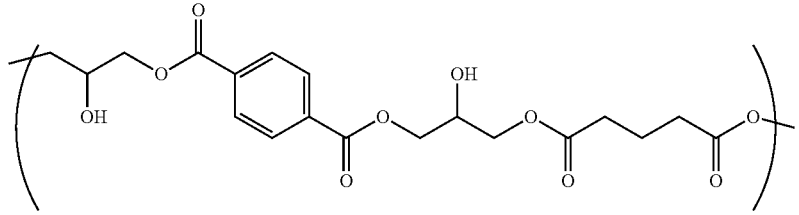
Formula(B-15)
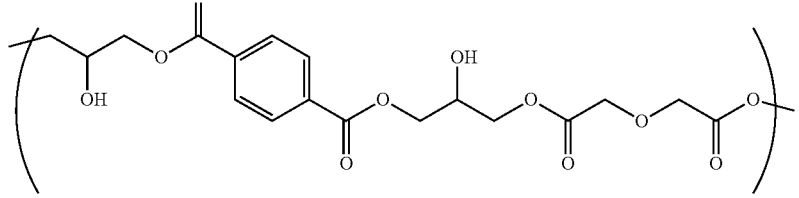
Formula(B-16)
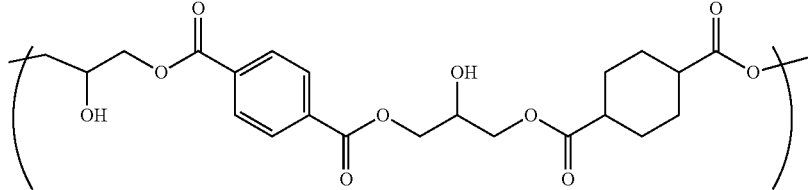
Formula(B-17)
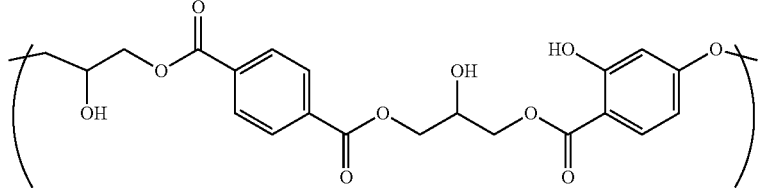

Formula(B-18)
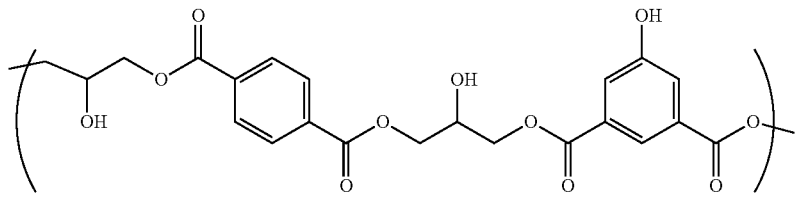
[Formula 14]
Formula(B-19)
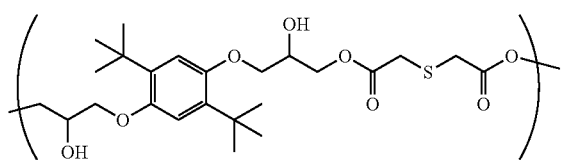
Formula(B-20)
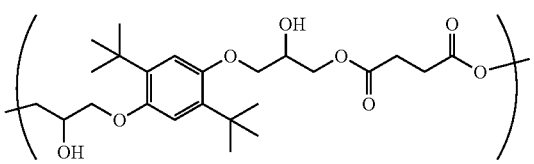
Formula(B-21)
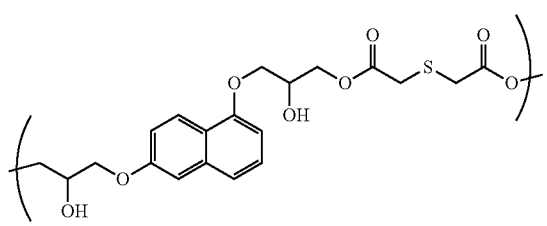
Formula(B-22)
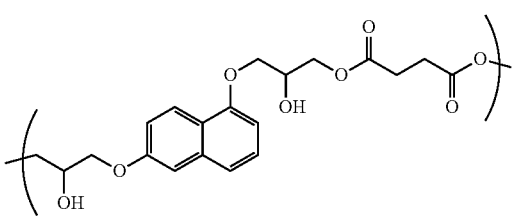
Formula(B-23)
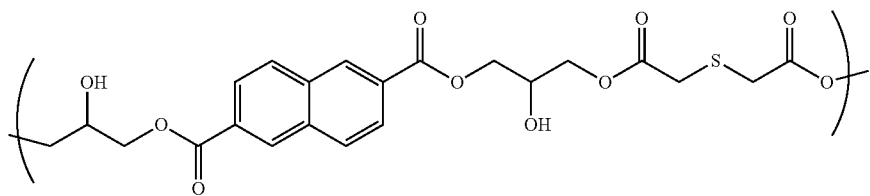
Formula(B-24)
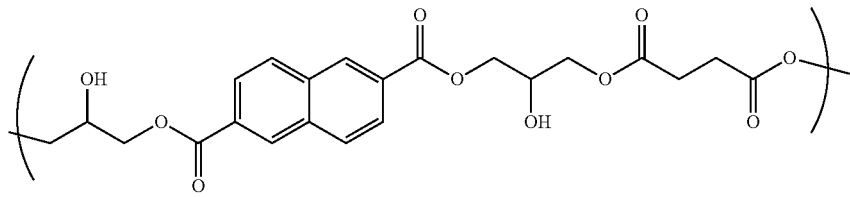
[Formula 15]
Formula(B-25)
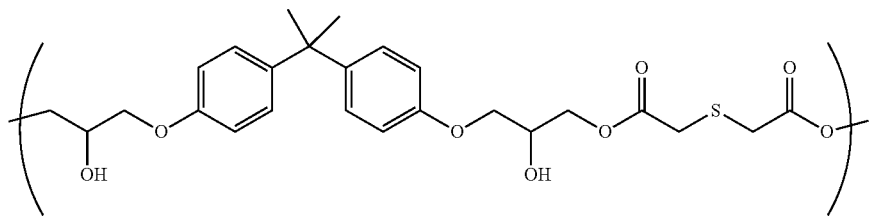
Formula(B-26)
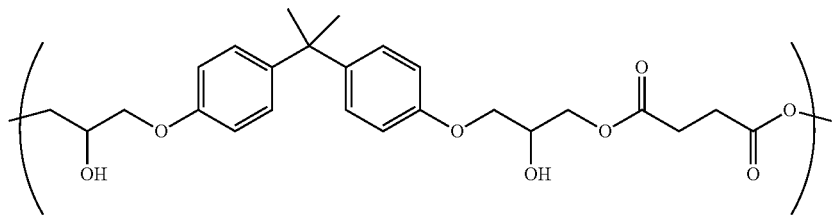

Formula(B-27)

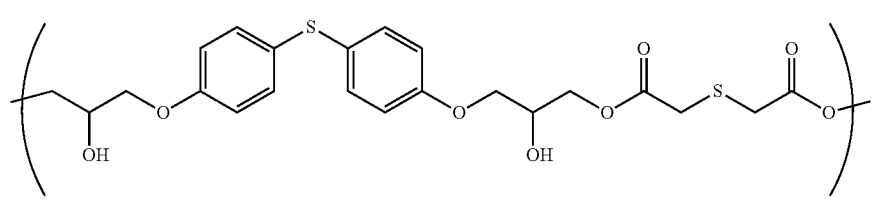

Formula(B-28)

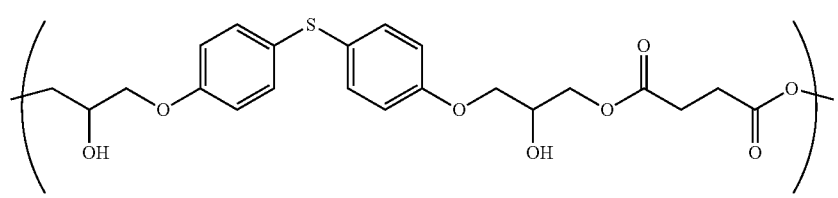

The above-mentioned diepoxy compound (A) includes an aryl diglycidyl ether compound and an aryl diglycidyl ester compound. The phenyl diglycidyl ether compound or phenyl diglycidyl ester compound having the structural unit of formula (A-3) may be exemplified, for example, as follows.

[Formula 16]

Formula(D-1)

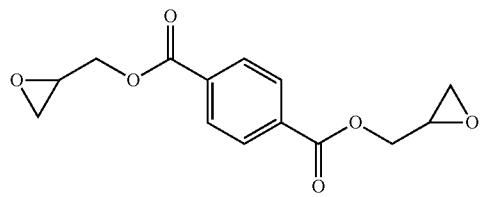

Formula(D-2)

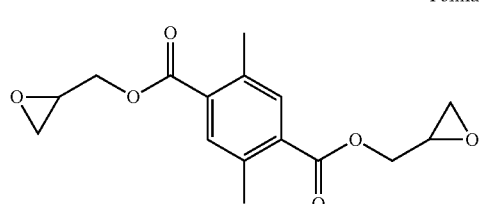

Formula(D-3)

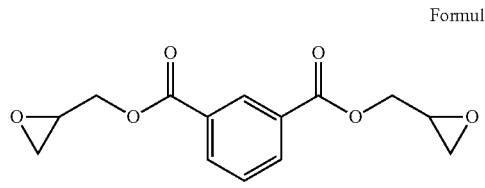

Formula(D-4)

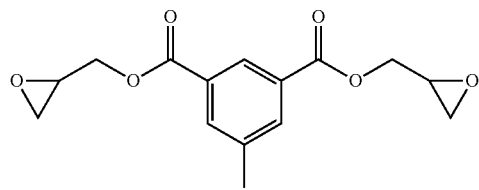

Formula(D-5)

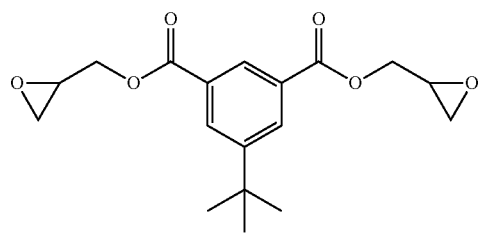

Formula(D-6)

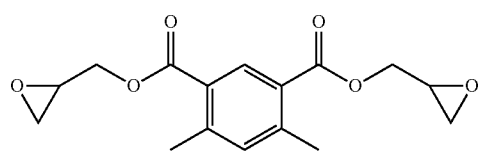

Formula(D-7)

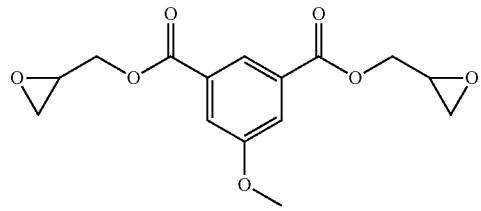

Formula(D-8)

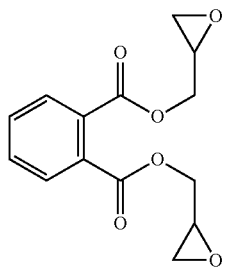

Formula(D-9)

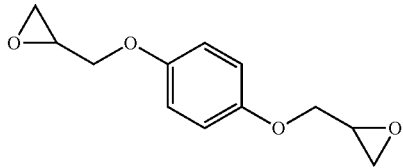

Formula(D-10)
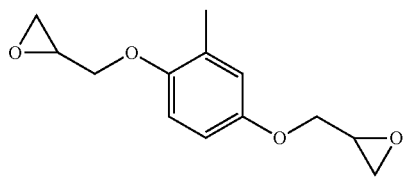

Formula(D-11)
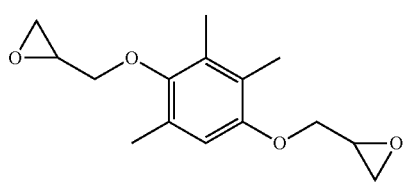

Formula(D-12)
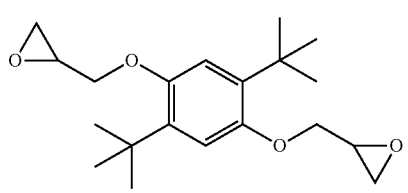

Formula(D-13)
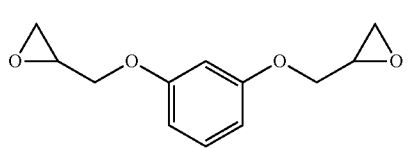

Formula(D-14)
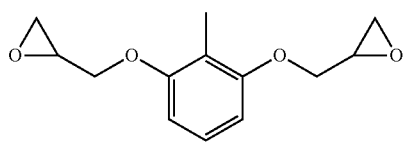

Formula(D-15)
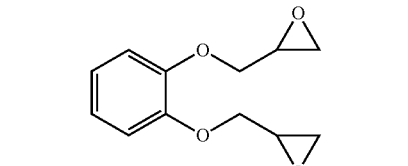

Formula(D-16)
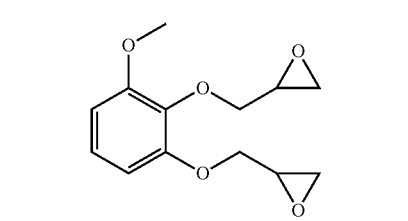

The compound represented by formula (D-1) is available as a product name: Denacol EX-711 from Nagase ChemteX Corporation.

The compound represented by formula (D-8) is available as a product name: Denacol EX-721 from Nagase ChemteX Corporation.

The compound represented by formula (D-13) is available as product names: Denacol EX-201 or Denacol EX-201-IM from Nagase ChemteX Corporation.

Further, the naphthyl diglycidyl ether compound or naphthyl diglycidyl ester compound having the structural unit of formula (A-4) may be exemplified, for example, as follows.

[Formula 17]

Formula(D-17)
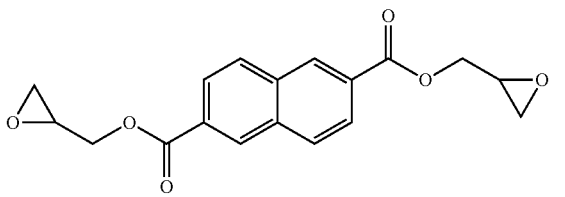

Formula(D-18)
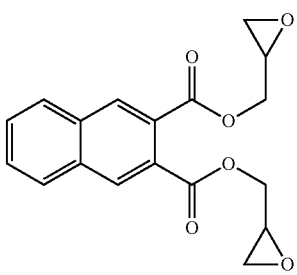

Formula(D-19)
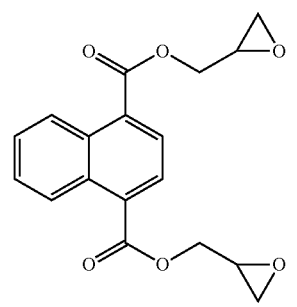

Formula(D-20)
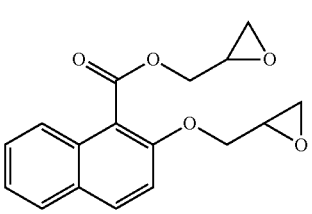

Formula(D-21)
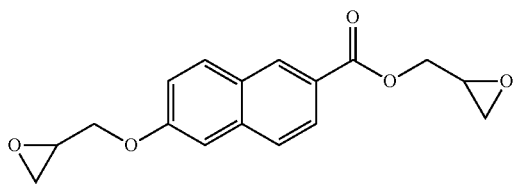

Formula(D-22)
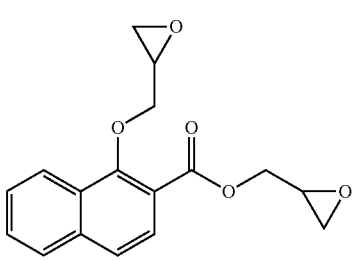

Formula(D-23)
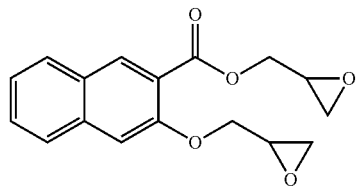

Formula(D-24)
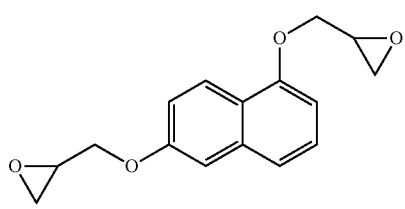

Formula(D-25)
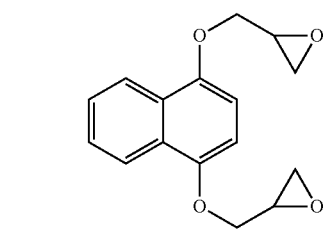

Formula(D-26)
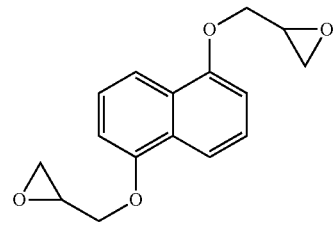

Formula(D-27)
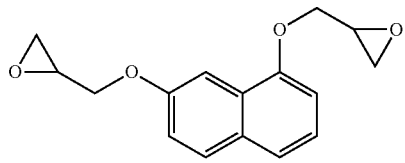

Formula(D-28)
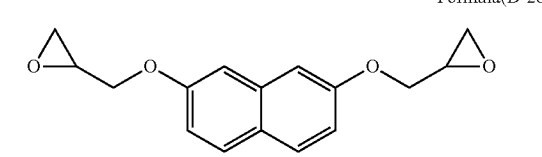

Formula(D-29)
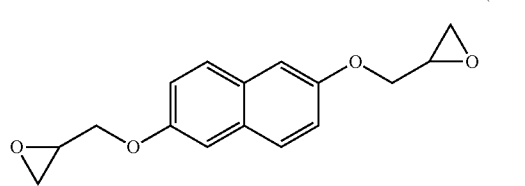

Formula(D-30)
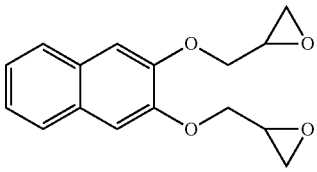

Moreover, the biphenyl diglycidyl ether compound, bisphenol diglycidyl ether compound, biphenyl diglycidyl ester compound or bisphenol diglycidyl ester compound having the structural unit of formula (A-5) may be exemplified, for example, as follows.

[Formula 18]

Formula (D-31)
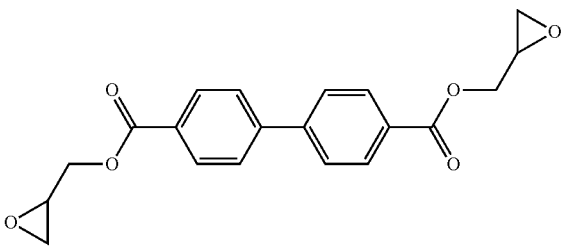

Formula (D-32)
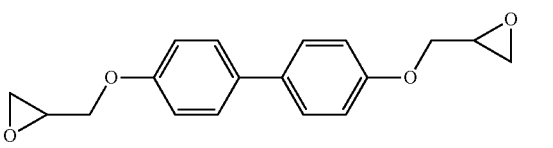

Formula (D-33)
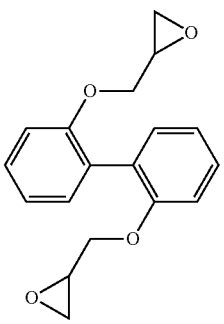

Formula (D-34)
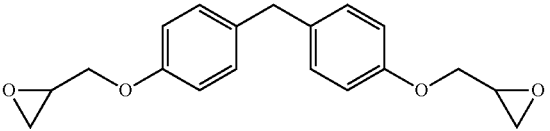

Formula (D-35)
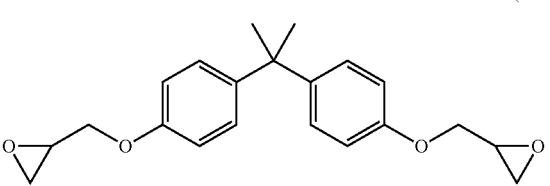

-continued

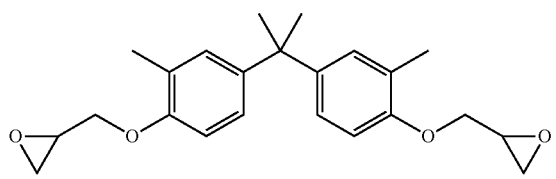

Formula (D-36)

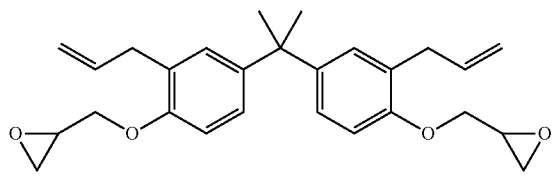

Formula (D-37)

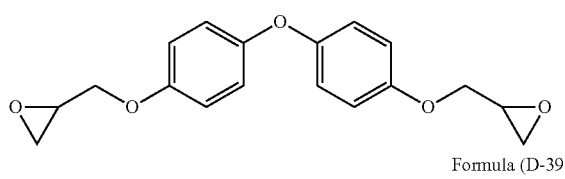

Formula (D-38)

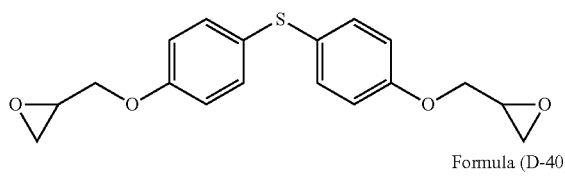

Formula (D-39)

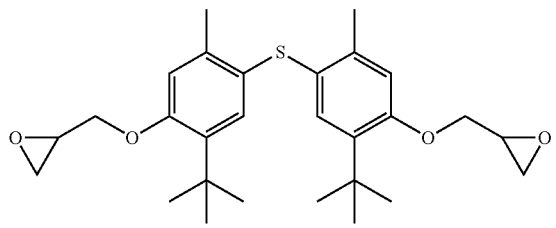

Formula (D-40)

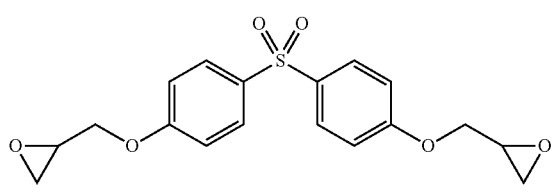

Formula (D-41)

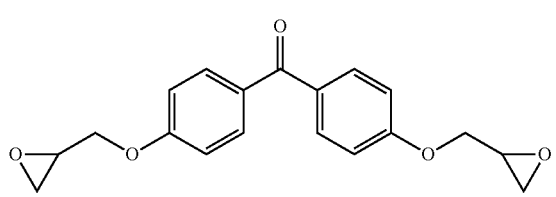

Formula (D-42)

The "functional" referred to in the above-mentioned bi- or higher functional proton-generating compound (B) is a concept focusing on the chemical properties and chemical reactivity of a substance. When a functional group is referred to, the physical properties and chemical reactivity inherent to a certain compound are reminded; however, in the present application, it refers to a reactive substituent that can be bonded to another compound by generating a proton. That is, for example, the term "bifunctional" means that two reactive substituents are possessed by the above-mentioned compound. Specific examples of the reactive substituent of the present application includes a hydroxy group, an epoxy group, an acyl group, an acetyl group, a formyl group, a benzoyl group, a carboxy group, a carbonyl group, an amino group, an imino group, a cyano group, an azo group, an azi group, a thiol group, a sulfo group and an allyl group.

The proton generating compound (B) of the present application is not particularly limited as long as it is bifunctional or higher, and preferably tetrafunctional or lower, preferably trifunctional or lower and most preferably bifunctional.

The bi- or higher functional proton-generating compound (B) of the present application includes, for example, a compound containing two or more carboxy groups, a compound containing two or more hydroxyl groups and a compound containing two or more thiol groups.

One or two or more species of the above-mentioned functional group may be present in the compound. Preferably two or less species of the functional groups are present, and preferably a single species of the functional group is present.

The carboxy group-containing compound, hydroxyl group-containing compound and thiol group-containing compound having the structural unit of the above-mentioned formula (A-6) include, for example, the following.

[Formula 19]

HOOC—COOH  Formula(E-1)

HOOC$\diagup$COOH  Formula(E-2)

HOOC$\diagup\diagdown$COOH  Formula(E-3)

HOOC$\diagup\diagdown$COOH  Formula(E-4)

HOOC$\diagup\diagdown$COOH  Formula(E-5)

HOOC$\diagup\diagdown$COOH  Formula(E-6)

HOOC$\diagup\diagdown$COOH  Formula(E-7)

HOOC$\diagup\diagdown$COOH  Formula(E-8)

HOOC$\diagup\diagdown$COOH  Formula(E-9)

HOOC$\diagup\diagdown\diagup$COOH  Formula(E-10)

HOOC$\diagup$(OH)$\diagdown$COOH  Formula(E-11)

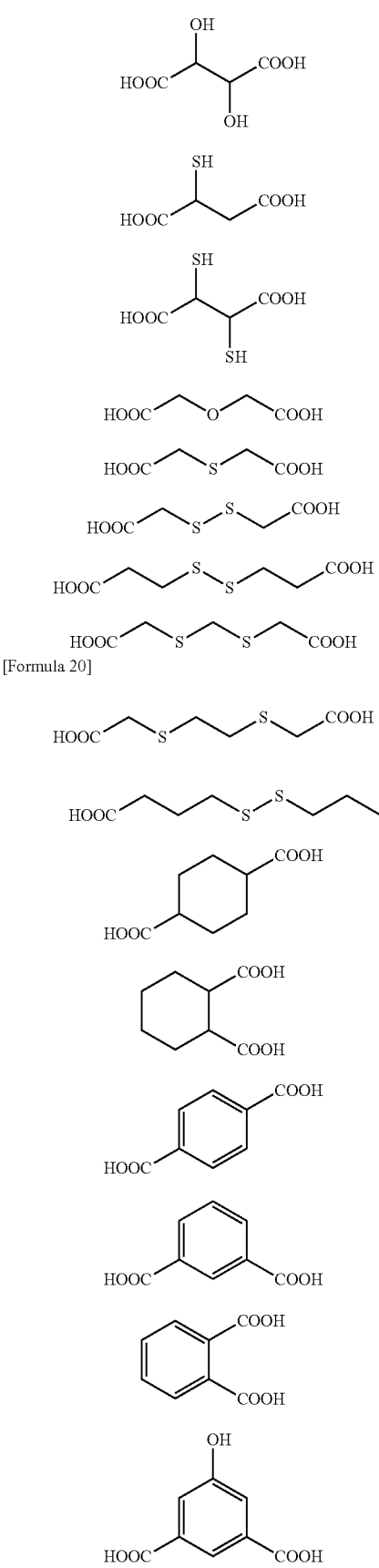

Formula(E-12)
Formula(E-13)
Formula(E-14)
Formula(E-15)
Formula(E-16)
Formula(E-17)
Formula(E-18)
Formula(E-19)
[Formula 20]
Formula(E-20)
Formula(E-21)
Formula(E-22)
Formula(E-23)
Formula(E-24)
Formula(E-25)
Formula(E-26)
Formula(E-27)

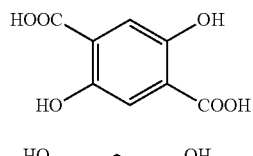

Formula(E-28)

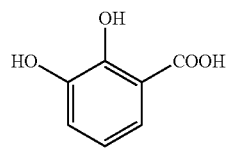

Formula(E-29)

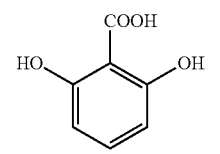

Formula(E-30)

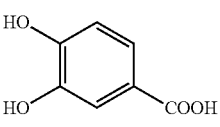

Formula(E-31)

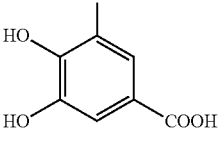

Formula(E-32)

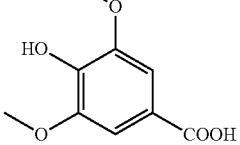

Formula(E-33)

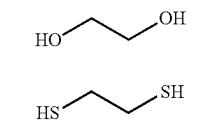

Formula(E-34)

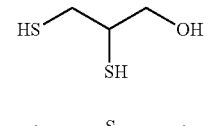

Formula(E-35)

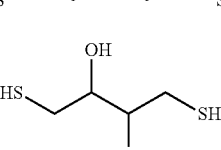

Formula(E-36)

Formula(E-37)

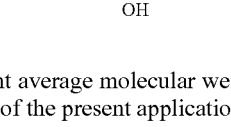

Formula(E-38)

Formula(E-39)

The weight average molecular weight of the polymerization product of the present application is within the range of preferably 500 to 10,000, and further preferably 700 to 5,000.

Solvent

The protective film-forming composition of the present invention may be prepared by dissolving each of the above-mentioned components in an organic solvent, and may be used in a uniform solution state.

As the solvent of the protective film-forming composition according to the present invention, any solvents capable of dissolving the above-mentioned ring-opening polymerization product (C) may be used without any particular limitation. In particular, since the protective film-forming composition according to the present invention is used in a uniform solution state, it is recommended to use a solvent usually used in the lithography process in combination in view of its application performance.

The above-mentioned organic solvents include, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide and N,N-dimethylacetamide. These solvents may be used alone or in combination of two or more.

Of these solvents, propylene glycol monomethyl ether, propylene glycol monomethyl ether acetate, ethyl lactate, butyl lactate, cyclohexanone and the like are preferable. In particular, propylene glycol monomethyl ether and propylene glycol monomethyl ether acetate are preferable.

Cross-Linking Catalyst

The protective film-forming composition of the present invention may contain a cross-linking catalyst as an optional component to promote the cross-linking reaction. As the cross-linking catalysts, in addition to the acidic compound, a compound that generates an acid or a base by heat may be used. As the acidic compound, a sulfonic acid compound or a carboxylic acid compound may be used, and as the compound that generates an acid by heat, a thermal acid generator may be used.

The sulfonic acid compound or the carboxylic acid compound includes, for example, p-toluenesulfonic acid, trifluoromethanesulfonic acid, pyridinium trifluoromethanesulfonate, pyridinium-p-toluenesulfonate, pyridinium-4-hydroxybenzenesulfonate, salicylic acid, camphor sulfonic acid, 5-sulfosalicyclic acid, 4-chlorobenzenesulfonic acid, 4-hydroxybenzenesulfonic acid, pyridinium-4-hydroxybenzenesulfonic acid, benzenedisulfonic acid, 1-naphthalenesulfonic acid, 4-nitrobenzenesulfonic acid, citric acid, benzoic acid and hydroxybenzoic acid.

The thermal acid generator includes, for example, K-PURE [Registered Trademark] CXC-1612, ditto CXC-1614, ditto TAG-2172, ditto TAG-2179, ditto TAG-2678 and ditto TAG2689 (all available from King Industries, Inc.), and SI-45, SI-60, SI-80, SI-100, SI-110 and SI-150 (all available from SANSHIN CHEMICAL INDUSTRY CO., LTD.).

Also, as the basic compound, an amine compound or an ammonium hydroxide compound may be used, and as the compound that generates a base by heat, urea may be used.

The amine compound includes, for example, tertiary amines such as triethanolamine, tributanolamine, trimethylamine, triethylamine, tri-normal-propylamine, triisopropylamine, tri-normal-butylamine, tri-tert-butylamine, tri-normal-octylamine, triisopropanolamine, phenyldiethanolamine, stearyl diethanolamine, diazabicyclooctane, etc., and aromatic amines such as pyridine, 4-dimethylaminopyridine, etc. In addition, it includes primary amines such as benzylamine, normal-butylamine, etc., and secondary amines such as diethylamine, di-normal-butylamine, etc. as the amine compound. These amine compounds may be used alone or in combination of two or more.

The ammonium hydroxide compound includes, for example, tetramethylammonium hydroxide, tetraethylammonium hydroxide, tetrapropyl-ammonium hydroxide, tetrabutylammonium hydroxide, benzyltrimethylammonium hydroxide, benzyltriethylammonium hydroxide, cetyltrimethylammonium hydroxide, phenyltrimethylammonium hydroxide and phenyltriethylammonium hydroxide.

Also, a compound having a thermolabile group, such as an amide group, a urethane group or an aziridine group, which generates an amine by heating may be used as the compound that generates a base by heat, for example. In addition, the compound that generates a base by heat includes urea, benzyltrimethylammonium chloride, benzyltriethylammonium chloride, benzyldimethylphenylammonium chloride, benzyldodecyldimethylammonium chloride, benzyltributylammonium chloride and choline chloride.

These cross-linking catalysts may be used alone or in combination of two or more.

When the above-mentioned protective film-forming composition contains the cross-linking catalyst, its content is within the range of 0.0001 to 20% by weight, preferably 0.01 to 15% by weight, and further preferably 0.1 to 10% by mass, based on the total solid content of the protective film-forming composition.

Cross-Linking Agent

The resist underlayer film forming composition of the present invention may contain a cross-linking agent component. The cross-linking agent includes a melamine-based, substituted urea-based or polymer-based cross-linking agent, etc. It is preferably a cross-linking agent having at least two cross-linking formable substituents, and it is a compound such as methoxymethylated glycol uril, butoxymethylated glycol uril, methoxymethylated melamine, butoxymethylated melamine, methoxymethylated benzoguanamine, butoxymethylated benzoguanamine, methoxymethylated urea, butoxymethylated urea, methoxymethylated thiourea, methoxymethylated thiourea, or the like. In addition, a condensed product of these compounds may be used.

Also, as the above-mentioned cross-linking agent, a cross-linking agent having high heat resistance may be used. As the cross-linking agent having high heat resistance, a compound containing a cross-linking formable substituent having an aromatic ring (for example, benzene ring, naphthalene ring) in the molecule may be used.

Such a compound includes a compound having a partial structure of the following formula (5-1) and a polymer or oligomer having a recurring unit of the following formula (5-2).

[Formula 21]

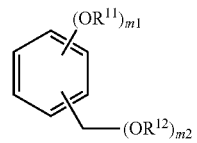

Formula(5-1)

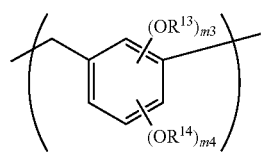

Formula(5-2)

The above-mentioned $R^{11}$, $R^{12}$, $R^{13}$ and $R^{14}$ are each a hydrogen atom or an alkyl group having 1 to 10 carbon atoms, and these alkyl groups may be referred to the above-mentioned exemplification.

m1 meets $1 \leq m1 \leq 6-m2$, m2 meets $1 \leq m2 \leq 5$, m3 meets $1 \leq m3 \leq 4-m2$, and m4 meets $1 \leq m4 \leq 3$.

Examples of the compound, polymer or oligomer of formula (5-1) and formula (5-2) are as follows.

[Formula 22]

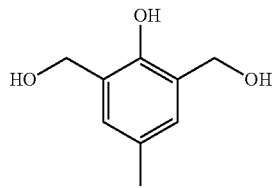

Formula(6-1)

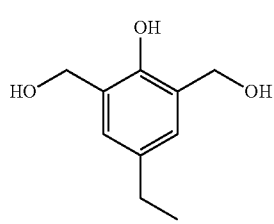

Formula(6-2)

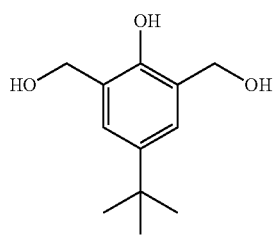

Formula(6-3)

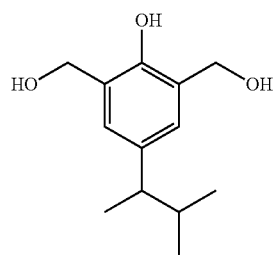

Formula(6-4)

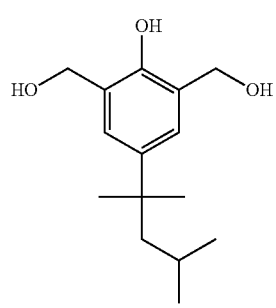

Formula(6-5)

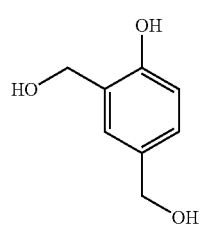

Formula(6-6)

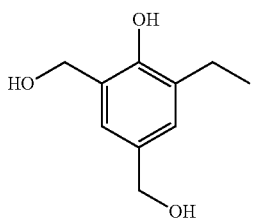

Formula(6-6)

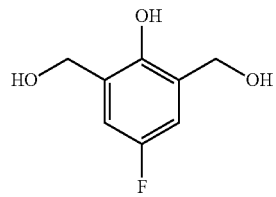

Formula(6-7)

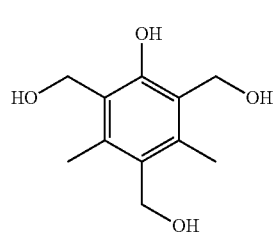

Formula(6-8)

Formula(6-9)

Formula(6-10)

Formula(6-11)

Formula(6-12)

Formula(6-13)

Formula(6-14)

[Formula 23]

Formula(6-15)

Formula(6-16)

Formula(6-17)

Formula(6-18)

Formula(6-19)

Formula(6-20)

Formula(6-21)

Formula(6-22)

Formula(6-23)

-continued

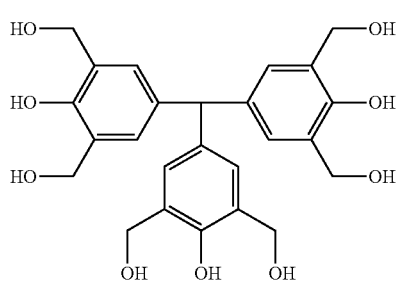

Formula(6-24)

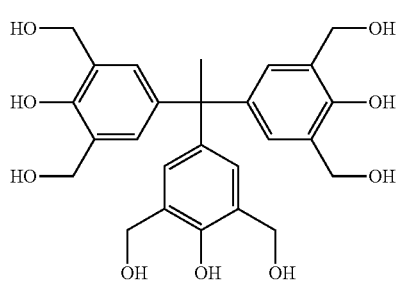

Formula(6-25)

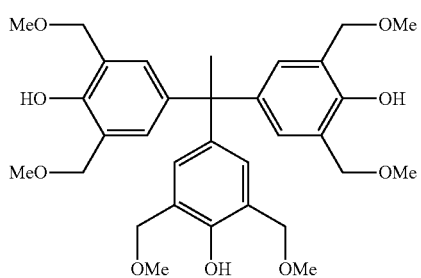

Formula(6-26)

The above-mentioned compounds are commercially available as products from ASAHI YUKIZAI CORPORATION or Honshu Chemical Industry Co., Ltd. For example, in the above-mentioned cross-linking agents, the compound of formula (6-22) is available as product name: TMOM-BP from ASAHI YUKIZAI CORPORATION.

These cross-linking agents may be used alone or in combination of two or more.

The amount of the cross-linking agent to be added may vary depending on a coating solvent to be used, a base substrate to be used, a solution viscosity to be required, a film shape to be required, or the like, and it is within the range of 0.001 to 80% by weight, preferably 0.01 to 50% by weight, and further preferably 0.1 to 40% by weight based on the total solid content of the protective film-forming composition. Although these cross-linking agents may sometimes cause a cross-linking reaction due to self-condensation, they can cause a cross-linking reaction with cross-linkable substituents, when the cross-linkable substituents are present in the above-mentioned polymer of the present invention.

Surfactant

The protective film-forming composition of the present invention may contain a surfactant as an optional component to improve its applicability to the semiconductor substrate. The above-mentioned surfactants includes, for example, nonionic surfactants including polyoxyethylene alkyl ethers such as polyoxyethylene lauryl ether, polyoxyethylene stearyl ether, polyoxyethylene cetyl ether, polyoxyethylene oleyl ether, etc., polyoxyethylene alkyl aryl ethers such as polyoxyethylene octylphenyl ether, polyoxyethylene nonyl phenyl ether, etc., sorbitan fatty acid esters such as polyoxyethylene-polyoxypropylene block copolymers, sorbitan monolaurate, sorbitan monopalmitate, sorbitan monostearate, sorbitan monooleate, sorbitan trioleate, sorbitan tristearate, etc., polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc., fluorine-based surfactants including EFTOP [Registered Trademark] EF301, ditto EF303, ditto EF352 (available from Mitsubishi Materials Electronic Chemicals, Co., Ltd.), MEGAFACE [Registered Trademark] F171, ditto F173, ditto R-30, ditto R-30N, ditto R-40, ditto R-40-LM (available from DIC Corporation), FLUORAD FC430, ditto FC431 (available from Sumitomo 3M Limited), AsahiGuard [Registered Trademark] AG710, Surflon [Registered Trademark] S-382, ditto SC101, ditto SC102, ditto SC103, ditto SC104, ditto SC105, ditto SC106 (available from Asahi Glass Co., Ltd.), etc., and organosiloxane polymer KP341 (available from Shin-Etsu Chemical Co., Ltd.). These surfactants may be used alone or in combination of two or more. When the above-mentioned protective film-forming composition contains a surfactant, the content thereof is within the range of 0.0001 to 10% by weight, preferably 0.01 to 5% by weight based on the total solid content of the protective film-forming composition.

Other Components

To the protective film-forming composition of the present invention, a light absorbing agent, a rheology adjusting agent, an adhesive auxiliary agent, etc., may be added. The rheology adjusting agent is effective in improving fluidity of the protective film-forming composition. The adhesive auxiliary agent is effective in improving adhesion between the underlayer film and the semiconductor substrate or resist.

The light absorbing agent that may suitably be used includes, for example, the commercially available light absorbing agents described in "Technology and Market of Industrial Dyes" (CMC Publishing Co., Ltd.) or "Dye Handbook" (edited by The Society of Organic Synthetic Chemistry, Japan), such as C.I. Disperse Yellow 1, 3, 4, 5, 7, 8, 13, 23, 31, 49, 50, 51, 54, 60, 64, 66, 68, 79, 82, 88, 90, 93, 102, 114 and 124; C.I. Disperse Orangel, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.I. Disperse Violet 43; C.I. Disperse Blue 96; C.I. Fluorescent Brightening Agents 112, 135 and 163; C.I. Solvent Orange 2 and 45; C.I. Solvent Red 1, 3, 8, 23, 24, 25, 27 and 49; C.I. Pigment Green 10; and C.I. Pigment Brown 2, etc.

The above-mentioned light absorbing agent is usually formulated in a proportion of 10% by mass or less, and preferably 5% by mass or less based on the total solid content of the protective film-forming composition.

The rheology adjusting agent is added for the purpose of mainly improving fluidity of the protective film-forming composition, and particularly in the baking process, improving uniformity of the film thickness of the resist underlayer film or heightening filling property of the protective film-forming composition inside the hole. Specific examples thereof include phthalic acid derivatives such as dimethyl phthalate, diethyl phthalate, diisobutyl phthalate, dihexyl phthalate, butylisodecyl phthalate, etc., adipic acid derivatives such as di-normal-butyl adipate, diisobutyl adipate, diisooctyl adipate, octyldecyl adipate, etc., maleic acid derivatives such as di-normal-butylmaleate, diethyl maleate, dinonyl maleate, etc., oleic acid derivatives such as methyl oleate, butyl oleate, tetrahydrofurfuryl oleate, etc., or stearic acid derivatives such as normal-butyl stearate, glyceryl stearate, etc. These rheology adjusting agents are usually formulated in a proportion of less than 30% by mass based on the total solid content of the protective film-forming composition.

The adhesive auxiliary agent is added for the purpose of mainly improving adhesiveness between the protective film-forming composition and the substrate or resist, and particularly preventing the resist from peeling off during development. Specific examples thereof include chlorosilanes such as trimethylchlorosilane, dimethylmethylol chlorosilane, methyldiphenylchlorosilane, chloromethyldimethylchlorosilane, etc., alkoxysilanes such as trimethylmethoxysilane, dimethyldiethoxysilane, methyldimethoxysilane, dimethylmethylol ethoxysilane, diphenyldimethoxysilane, phenyltriethoxysilane, etc., silazanes such as hexamethyldisilazane, N,N'-bis(trimethylsilyl)urea, dimethyltrimethylsilylamine, trimethyl-silylimidazole, etc., silanes such as methylol trichlorosilane, γ-chloropropyltrimethoxy-silane, γ-aminopropyltriethoxysilane, γ-glycidoxypropyltrimethoxysilane, etc., heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine, etc., ureas such as 1,1-dimethylurea, 1, 3-dimethylurea, etc., or a thiourea compound. These adhesive auxiliary agents are usually formulated in a proportion of less than 5% by mass, and preferably less than 2% by mass based on the total solid content of the protective film-forming composition.

Protective Film-Forming Composition

A solid content of the protective film-forming composition according to the present invention is usually made 0.1 to 70% by mass, and preferably 0.1 to 60% by mass. The solid content is the content ratio of all the components excluding the solvent from the protective film-forming composition. The proportion of the ring-opening polymerized product in the solid content is within the range of 1 to 100% by mass, 1 to 99.9% by mass, 50 to 99.9% by mass, 50 to 95% by mass, and 50 to 90% by mass by increasing preference.

Protective Film, Producing Method of Substrate Equipped with Resist Pattern, and Manufacturing Method of Semiconductor Device Hereinafter, a protective film produced by using the protective film-forming composition according to the present invention, a producing method of a substrate equipped with a resist pattern, and a manufacturing method of a semiconductor device will be explained.

The substrate equipped with a resist pattern according to the present invention may be produced by applying the above-mentioned protective film-forming composition onto a semiconductor substrate and baking the applied composition.

The semiconductor substrate to which the protective film-forming composition of the present invention is applied includes, for example, silicon wafers, germanium wafers, and compound semiconductor wafers such as gallium arsenide, indium phosphate, gallium nitride, indium nitride, aluminum nitride, etc.

When a semiconductor substrate carrying an inorganic film formed on the surface is used, the inorganic film may be formed by, for example, ALD (atomic layer deposition) method, CVD (chemical vapor deposition) method, reactive sputtering method, ion plating method, vacuum deposition method, or spin coating method (spin-on-glass: SOG). The inorganic film includes, for example, a polysilicon film, a silicon oxide film, a silicon nitride film, a BPSG (Boro-Phospho Silicate Glass) film, a titanium nitride film, a titanium oxynitride film, a tungsten nitride film, a gallium nitride film and a gallium arsenide film.

Onto such a semiconductor substrate, the protective film-forming composition of the present invention is applied by a suitable application method such as a spinner, a coater, etc. Thereafter, by baking the applied composition using a heating means such as a hot plate, etc., a protective film is formed. As the baking conditions, these are appropriately selected from a baking temperature of 100° C. to 400° C. and a baking time of 0.3 minute to 60 minutes. These are preferably a baking temperature of 120° C. to 350° C. and a baking time of 0.5 minute to 30 minutes, and more preferably a baking temperature of 150° C. to 300° C. and a baking time of 0.8 minute to 10 minutes. The film thickness of the protective film to be formed, for example, is within the range of 0.001 µm to 10 µm, preferably 0.002 µm to 1 µm, and more preferably 0.005 µm to 0.5 µm. If the temperature at the time of baking is lower than the above-mentioned range, cross-linking sometimes becomes insufficient so that a resistance of the formed protective film to a resist solvent or a basic aqueous hydrogen peroxide solution is sometimes difficultly obtained. On the other hand, if the temperature at the time of baking is higher than the above-mentioned range, the protective film is sometimes decomposed by heat.

The exposure is carried out through a mask (reticle) for forming a predetermined pattern, and for example, i-line, KrF excimer laser, ArF excimer laser, EUV (extreme ultraviolet) or EB (electron beam) is used. For the development, an alkaline developer is used, and the conditions are appropriately selected from a development temperature of 5° C. to 50° C. and a development time of 10 seconds to 300 seconds. The alkaline developer that may be used includes, for example, an aqueous solution of alkalis including inorganic alkalis such as sodium hydroxide, potassium hydroxide, sodium carbonate, sodium silicate, sodium metasilicate, aqueous ammonia, etc., primary amines such as ethylamine, n-propylamine, etc., secondary amines such as diethylamine, di-n-butylamine, etc., tertiary amines such as triethylamine, methyl-diethylamine, etc., alcohol amines such as dimethylethanolamine, triethanolamine, etc., quaternary ammonium salts such as tetramethylammonium hydroxide, tetraethylammonium hydroxide, choline, etc., cyclic amines such as pyrrole, piperidine, etc. Further, it is also possible to use the above-mentioned aqueous solution of the alkalis by adding an appropriate amount of an alcohol such as isopropyl alcohol, etc., a surfactant such as nonionic, etc. Of these, a preferable developer is a quaternary ammonium salt, and more preferably tetramethylammonium hydroxide and choline. Moreover, it is possible to add a surfactant, etc., to these developers. It is also possible to use a method including the step of developing the portion in which an alkali dissolution rate of the photoresist has not been improved, while using an organic solvent such as butyl acetate, etc. in place of the alkaline developer.

Next, using the formed resist pattern as a mask, the protective film is subjected to dry etching. At that time, the surface of inorganic film is allowed to expose if the inorganic film has been formed on the surface of the semiconductor substrate used, and the surface of semiconductor substrate is allowed to expose if no inorganic film has been formed on the surface of the semiconductor substrate used.

Further, using the protective film (and also the resist pattern if it remains on the protective film) after dry etching as a mask, wet etching is carried out using a wet etching liquid for semiconductors to form a desired pattern.

Wet Etching Liquid for Semiconductor

As the wet etching liquid for semiconductor, a chemical solution usually used for etching processing of a wafer for semiconductor may be used, and for example, both of a substance showing acidity and a substance showing basicity may be used.

The substance showing acidity includes, for example, hydrogen peroxide, hydrofluoric acid, ammonium fluoride, acidic ammonium fluoride, ammonium hydrogen fluoride, buffered hydrofluoric acid, hydrochloric acid, nitric acid, sulfuric acid, phosphoric acid or a mixed liquid of these. Specific examples thereof include SC-2 (hydrochloric acid-hydrogen peroxide solution).

The substance showing basicity includes basic aqueous hydrogen peroxide solution, in which a hydrogen peroxide solution is mixed with an organic amine such as ammonia, sodium hydroxide, potassium hydroxide, sodium cyanide, potassium cyanide, triethanolamine, etc., so as to make the pH of the resulting solution is basic. Specific examples thereof include SC-1 (ammonia-hydrogen peroxide solution). As others, any chemical liquid that can be basic pH may also be used as a chemical liquid for wet etching, such as a mixture of urea and a hydrogen peroxide solution, in which the thermal decomposition of urea generates ammonia, which in turn would ultimately make the mixture basic pH.

Of these, an acidic aqueous hydrogen peroxide or a basic aqueous hydrogen peroxide solution is preferable.

These chemical liquids may contain an additive such as a surfactant, etc.

An operating temperature of the wet etching liquid for semiconductor is desirably 25° C. to 90° C., and more desirably 40° C. to 80° C. As a wet etching time, it is desirable to be 0.5 min to 30 min, and further desirably 1 min to 20 min.

EXAMPLES

Next, the concept of the present invention will be explained specifically by referring to Examples, but the present invention is not limited thereto.

The device etc. used for determining the weight average molecular weight of the polymers obtained in Synthetic Examples below are shown as follows. Device: HLC-8320GPC manufactured by TOSOH CORPORATION GPC column: Shodex [registered trademark]·Asahipak [registered trademark] (SHOWADENKO K. K.)

Column temperature: 40° C.
Flow amount: 0.35 mL/min
Eluent: tetrahydrofuran (THF)
Standard sample: polystyrene (manufactured by TOSOH CORPORATION)

Example 1

A reaction flask containing 10.00 g of diglycidyl terephthalate (product name: Denacol EX-711, available from Nagase ChemteX Corporation), 8.70 g of 3,3'-dithiopropionic acid, 0.31 g of benzyltriethylammonium chloride and 107.76 g of propylene glycol monomethyl ether was heated while stirring at 100° C. for 24 hours. The obtained reaction product corresponded to formula (B-1). The weight average molecular weight Mw determined by GPC in terms of polystyrene was 3,200.

[Formula 24]

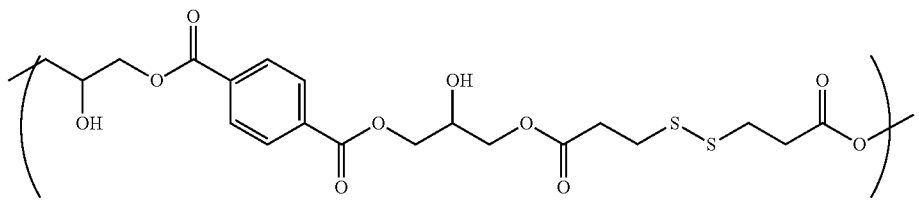

Formula(B-1)

To 4.04 g of the solution (the solid content is 16.2% by weight) of the reaction product corresponding to the above-mentioned formula (B-1) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 13.89 g of propylene glycol monomethyl ether and 1.92 g of propylene glycol monomethyl ether acetate to prepare a solution of a protective film-forming composition.

Example 2

A reaction flask containing 10.00 g of diglycidyl terephthalate (product name: Denacol EX-711, available from Nagase ChemteX Corporation), 6.21 g of 2,2'-thiodiglycolic acid, 0.64 g of ethyltriphenylphosphonium bromide and 67.42 g of propylene glycol monomethyl ether was heated while stirring at 100° C. for 23 hours. The obtained reaction product corresponded to formula (B-2). The weight average molecular weight Mw determined by GPC in terms of polystyrene was 2,700.

[Formula 25]

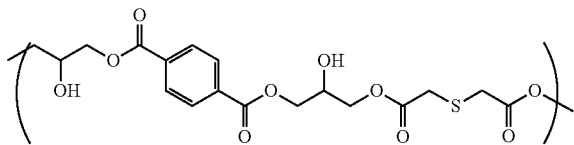

Formula(B-2)

To 3.93 g of the solution (the solid content is 16.7% by weight) of the reaction product corresponding to the above-mentioned formula (B-2) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 14.00 g of propylene glycol monomethyl ether and 1.92 g of propylene glycol monomethyl ether acetate to prepare a solution of a protective film-forming composition.

Example 3

A reaction flask containing a mixture of 10.00 g of diglycidyl terephthalate (product name: Denacol EX-711, available from Nagase ChemteX Corporation), 3.77 g of malonic acid, 0.64 g of ethyltriphenylphosphonium bromide, and 14.41 g of propylene glycol monomethyl ether was heated while stirring at 100° C. for 24 hours. Thereafter, 43.23 g of propylene glycol monomethyl ether was added to the mixture to dilute the same. The obtained reaction product corresponded to formula (B-3). The weight average molecular weight Mw determined by GPC in terms of polystyrene was 2,600.

[Formula 26]

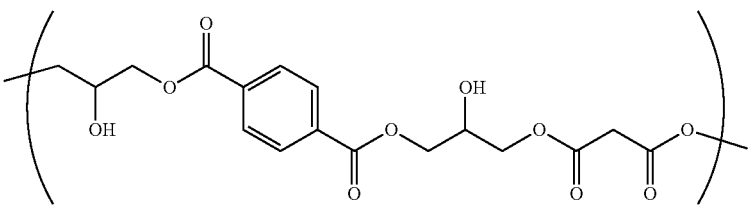

Formula(B-3)

To 3.79 g of the solution (the solid content is 17.3% by weight) of the reaction product corresponding to the above-mentioned formula (B-3) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 14.15 g of propylene glycol monomethyl ether and 1.92 g of propylene glycol monomethyl ether acetate to prepare a solution of a protective film-forming composition.

Example 4

A reaction flask containing 10.00 g of diglycidyl terephthalate (product name: Denacol EX-711, available from Nagase ChemteX Corporation), 4.89 g of succinic acid, 0.64 g of ethyltriphenylphosphonium bromide and 62.11 g of propylene glycol monomethyl ether was heated while stirring at 100° C. for 23 hours. The obtained reaction product corresponded to formula (B-4). The weight average molecular weight Mw determined by GPC in terms of polystyrene was 3,100.

[Formula 27]

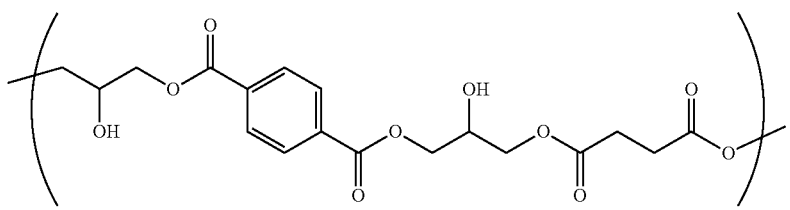

Formula(B-4)

To 4.03 g of the solution (the solid content is 16.3% by weight) of the reaction product corresponding to the above-mentioned formula (B-4) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 13.91 g of propylene glycol monomethyl ether and 1.92 g of propylene glycol monomethyl ether acetate to prepare a solution of a protective film-forming composition.

Example 5

A reaction flask containing 10.00 g of diglycidyl terephthalate (product name: Denacol EX-711, available from Nagase ChemteX Corporation), 5.38 g of itaconic acid, 0.64 g of ethyltriphenylphosphonium bromide, 0.02 g of hydroquinone, and 64.10 g of propylene glycol monomethyl ether was heated while stirring at 100° C. for 27 hours. The obtained reaction product corresponded to formula (B-5). The weight average molecular weight Mw determined by GPC in terms of polystyrene was 2,000.

[Formula 28]

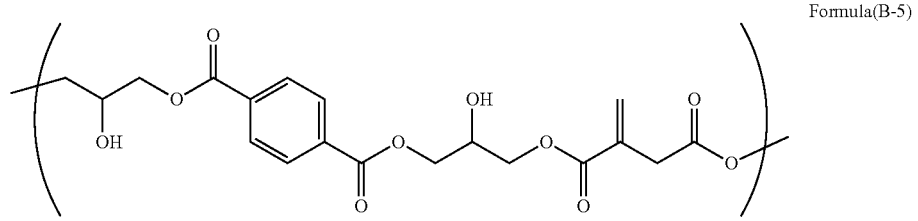

Formula(B-5)

To 3.73 g of the solution (the solid content is 17.6% by weight) of the reaction product corresponding to the above-mentioned formula (B-5) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 14.21 g of propylene glycol monomethyl ether and 1.92 g of propylene glycol monomethyl ether acetate to prepare a solution of a protective film-forming composition.

Example 6

A reaction flask containing 10.00 g of diglycidyl terephthalate (product name: Denacol EX-711, available from Nagase ChemteX Corporation), 6.21 g of tartaric acid, 0.64 g of ethyltriphenylphosphonium bromide and 67.41 g of propylene glycol monomethyl ether was heated while stirring at 100° C. for 18 hours. The obtained reaction product corresponded to formula (B-6). The weight average molecular weight Mw determined by GPC in terms of polystyrene was 2,600.

[Formula 29]

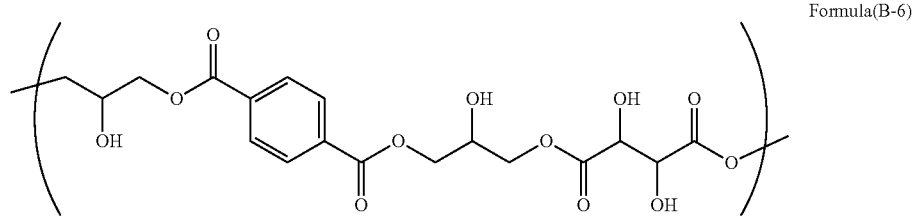

Formula(B-6)

To 3.52 g of the solution (the solid content is 18.6% by weight) of the reaction product corresponding to the above-mentioned formula (B-6) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxyphenylbenzene as a cross-linking catalyst, 0.001 g of a fluorine-based surfactant (product name: MEGAFACE R-40, available from DIC Corporation) as a surfactant, 14.41 g of propylene glycol monomethyl ether and 1.92 g of propylene glycol monomethyl ether acetate to prepare a solution of a protective film-forming composition.

Example 7

A reaction flask containing 10.00 g of diglycidyl phthalate (product name: Denacol EX-721, available from Nagase ChemteX Corporation), 4.62 g of succinic acid, 0.61 g of ethyltriphenylphosphonium bromide and 60.91 g of propylene glycol monomethyl ether was heated while stirring at 100° C. for 27 hours. The obtained reaction product corresponded to formula (B-7). The weight average molecular weight Mw determined by GPC in terms of polystyrene was 1,900.

[Formula 30]

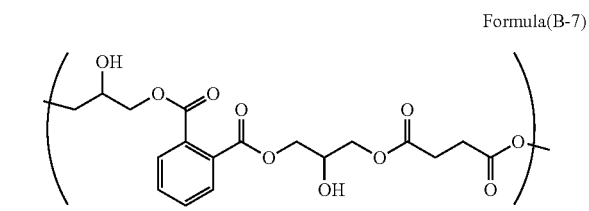

Formula(B-7)

To 4.07 g of the solution (the solid content is 16.1% by weight) of the reaction product corresponding to the above-mentioned formula (B-7) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 13.87 g of propylene glycol monomethyl ether and 1.92 g of propylene glycol monomethyl ether acetate to prepare a solution of a protective film-forming composition.

Example 8

A reaction flask containing a mixture of 10.00 g of diglycidyl phthalate (product name: Denacol EX-721, available from Nagase ChemteX Corporation), 5.09 g of itaconic acid, 0.61 g of ethyltriphenylphosphonium bromide, 0.02 g of hydroquinone and 36.63 g of propylene glycol monomethyl ether was heated while stirring at 100° C. for 27 hours. Thereafter, 18.31 g of propylene glycol monomethyl ether was added to the mixture to dilute the same. The obtained reaction product corresponded to formula (B-8). The weight average molecular weight Mw determined by GPC in terms of polystyrene was 1,500.

[Formula 31]

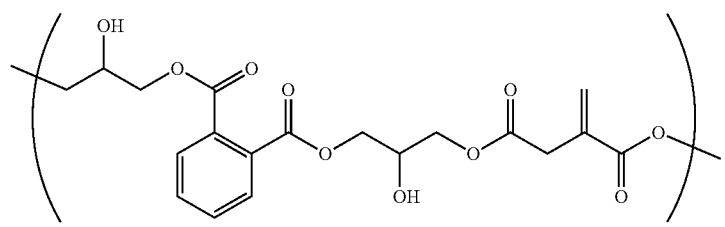

Formula(B-8)

To 3.59 g of the solution (the solid content is 18.2% by weight) of the reaction product corresponding to the above-mentioned formula (B-8) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 14.31 g of propylene glycol monomethyl ether and 1.92 g of propylene glycol monomethyl ether acetate to prepare a solution of a protective film-forming composition.

Example 9

A reaction flask containing 10.00 g of diglycidyl phthalate (product name: Denacol EX-721, available from Nagase ChemteX Corporation), 4.54 g of fumaric acid, 0.61 g of ethyltriphenylphosphonium bromide, 0.02 g of hydroquinone and 60.59 g of propylene glycol monomethyl ether was heated while stirring at 100° C. for 26 hours. The obtained reaction product corresponded to formula (B-9). The weight average molecular weight Mw determined by GPC in terms of polystyrene was 3,500.

[Formula 32]

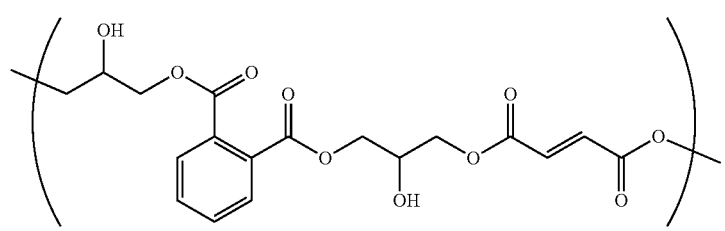

Formula(B-9)

To 4.16 g of the solution (the solid content is 16.8% by weight) of the reaction product corresponding to the above-mentioned formula (B-9) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 13.78 g of propylene glycol monomethyl ether and 1.92 g of propylene glycol monomethyl ether acetate to prepare a solution of a protective film-forming composition.

Example 10

A reaction flask containing 10.00 g of resorcinol diglycidyl ether (product name: Denacol EX-201-IM, available from Nagase ChemteX Corporation), 6.09 g of succinic acid, 0.80 g of ethyltriphenylphosphonium bromide and 67.55 g of propylene glycol monomethyl ether was heated while stirring at 100° C. for 27 hours. The obtained reaction product corresponded to formula (B-10). The weight average molecular weight Mw determined by GPC in terms of polystyrene was 3,000.

[Formula 33]

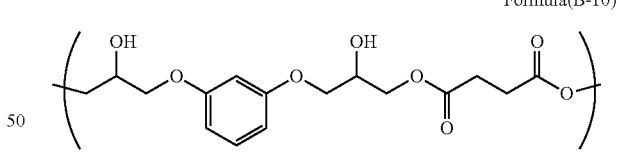

Formula(B-10)

To 3.93 g of the solution (the solid content is 16.7% by weight) of the reaction product corresponding to the above-mentioned formula (B-10) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 13.94 g of propylene glycol monomethyl ether and 1.92 g of propylene glycol monomethyl ether acetate to prepare a solution of a protective film-forming composition.

Example 11

A reaction flask containing 10.00 g of resorcinol diglycidyl ether (product name: Denacol EX-201-IM, available from Nagase ChemteX Corporation), 6.71 g of itaconic acid, 0.80 g of ethyltriphenylphosphonium bromide, 0.03 g of hydroquinone and 70.03 g of propylene glycol monomethyl ether was heated while stirring at 100° C. for 25 hours. The obtained reaction product corresponded to formula (B-11). The weight average molecular weight Mw determined by GPC in terms of polystyrene was 1,700.

[Formula 34]

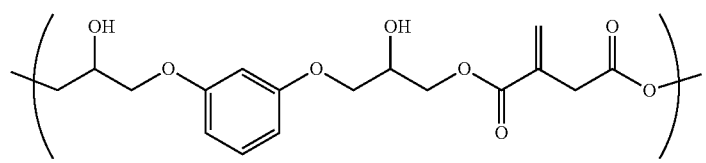

Formula(B-11)

To 3.60 g of the solution (the solid content is 18.2% by weight) of the reaction product corresponding to the above-mentioned formula (B-11) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 14.34 g of propylene glycol monomethyl ether and 1.92 g of propylene glycol monomethyl ether acetate to prepare a solution of a protective film-forming composition.

Example 12

A reaction flask containing 10.00 g of resorcinol diglycidyl ether (product name: Denacol EX-201-IM, available from Nagase ChemteX Corporation), 5.99 g of fumaric acid, 0.80 g of ethyltriphenylphosphonium bromide, 0.03 g of hydroquinone and 67.14 g of propylene glycol monomethyl ether was heated while stirring at 100° C. for 26 hours. The obtained reaction product corresponded to formula (B-12). The weight average molecular weight Mw determined by GPC in terms of polystyrene was 4,500.

[Formula 35]

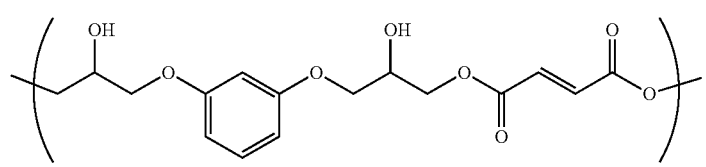

Formula(B-12)

To 3.92 g of the solution (the solid content is 16.7% by weight) of the reaction product corresponding to the above-mentioned formula (B-12) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 14.01 g of propylene glycol monomethyl ether and 1.92 g of propylene glycol monomethyl ether acetate to prepare a solution of a protective film-forming composition.

Comparative Example 1

A reaction flask containing 10.00 g of monoallyldiglycidylisocyanuric acid (product name: MA-DGICA, available from Shikoku Chemicals Corporation), 8.96 g of 3,3'-dithiopropionic acid, 0.66 g of ethyltriphenylphosphonium bromide and 78.47 g of propylene glycol monomethyl ether was heated while stirring at 100° C. for 23 hours. The obtained reaction product corresponded to formula (C-1).

The weight average molecular weight Mw determined by GPC in terms of polystyrene was 2,800.

[Formula 36]

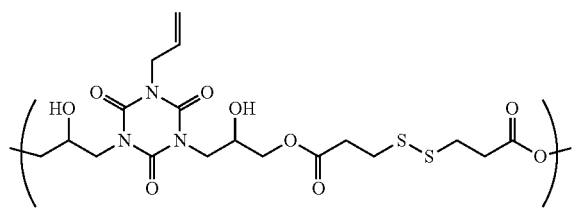

Formula(C-1)

To 3.97 g of the solution (the solid content is 16.5% by weight) of the reaction product corresponding to the above-mentioned formula (C-1) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium- 4-hydroxybenzenesulfonate as a cross-linking catalyst, 0.001 g of a fluorine-based surfactant (product name: MEGAFACE R-40, available from DIC Corporation) as a surfactant, 13.96 g of propylene glycol monomethyl ether and 1.92 g of propylene glycol monomethyl ether acetate to prepare a solution of a protective film-forming composition.

Comparative Example 2

A reaction flask containing 20.00 g of monomethyldiglycidylisocyanuric acid (product name: Me-DGICA, available from Shikoku Chemicals Corporation, 50% by weight propylene glycol monomethyl ether solution), 9.90 g of 3,3'-dithiopropionic acid, 0.73 g of ethyltriphenylphosphonium bromide and 72.51 g of propylene glycol monomethyl ether was heated while stirring at 100° C. for 22 hours. The obtained reaction product corresponded to formula (C-2). The weight average molecular weight Mw determined by GPC in terms of polystyrene was 1,900.

[Formula 37]

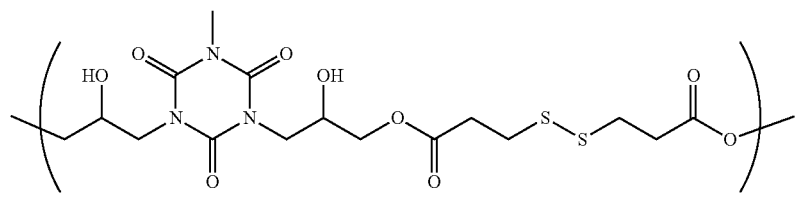

Formula(C-2)

To 4.08 g of the solution (the solid content is 16.1% by weight) of the reaction product corresponding to the above-mentioned formula (C-2) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 13.86 g of propylene glycol monomethyl ether and 1.92 g of propylene glycol monomethyl ether acetate to prepare a solution of a protective film-forming composition.

Comparative Example 3

A reaction flask containing 10.00 g of monoallyldiglycidylisocyanuric acid (product name: MA-DGICA, available from Shikoku Chemicals Corporation), 5.03 g of succinic acid, 0.66 g of ethyltriphenylphosphonium bromide and 62.76 g of propylene glycol monomethyl ether was heated while stirring at 100° C. for 23 hours. The obtained reaction product corresponded to formula (C-3). The weight average molecular weight Mw determined by GPC in terms of polystyrene was 4,400.

[Formula 38]

Formula(C-3)

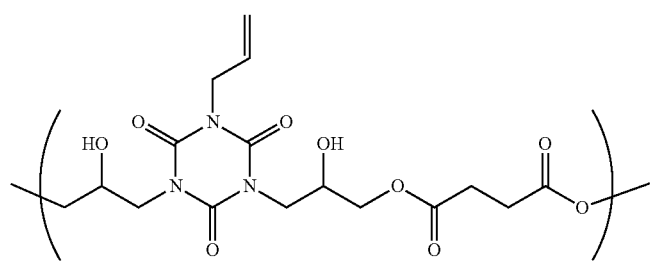

To 3.81 g of the solution (the solid content is 17.2% by weight) of the reaction product corresponding to the above-mentioned formula (C-3) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 14.12 g of propylene glycol monomethyl ether and 1.92 g of propylene glycol monomethyl ether acetate to prepare a solution of a protective film-forming composition.

Comparative Example 4

A solution of 5.00 g of glycidyl methacrylate, 5.21 g of 5-vinylbenzo[d][1,3]-dioxol (available from Cool Pharm LTD.), 0.58 g of 2,2'-azobis(isobutyronitrile) and 34.53 g of propylene glycol monomethyl ether was charged in a dropping funnel, and the solution was added dropwise to a reaction flask containing 8.63 g of propylene glycol monomethyl ether under nitrogen atmosphere at 100° C. The resultant solution was stirred while heating for 20 hours. The obtained reaction product corresponded to formula (C-4). The weight average molecular weight Mw determined by GPC in terms of polystyrene was 9,000.

[Formula 39]

Formula(C-4)

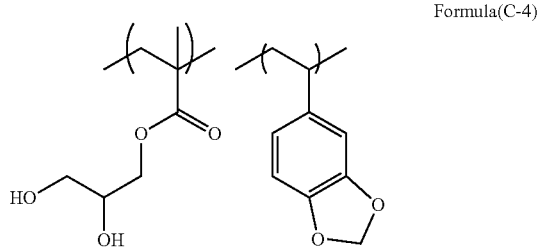

To 4.06 g of the solution (the solid content is 16.1% by weight) of the reaction product corresponding to the above-mentioned formula (C-4) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 13.87 g of propylene glycol monomethyl ether and 1.92 g of propylene glycol monomethyl ether acetate to prepare a solution of a protective film-forming composition.

Comparative Example 5

A solution of 16.00 g of glycidyl methacrylate, 4.53 g of 2,2'-azobis(isobutyronitrile) and 65.68 g of propylene glycol monomethyl ether was charged in a dropping funnel, and the solution was added dropwise to a reaction flask containing 16.48 g of propylene glycol monomethyl ether under nitrogen atmosphere at 100° C. The resultant solution was stirred while heating for 13 hours. To 30.00 g (epoxy value: 676 g/eq) of the thus treated solution were added 5.31 g of 3,4-dihydroxybenzoic acid, 0.20 g of benzyltriethylammonium chloride and 17.89 g of propylene glycol monomethyl ether. The resultant solution was stirred while heating under nitrogen atmosphere under reflux for 20 hours. The obtained reaction product corresponded to formula (C-5). The weight average molecular weight Mw determined by GPC in terms of polystyrene was 24,400.

[Formula 40]

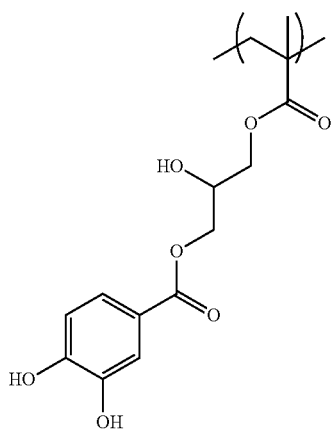

Formula(C-5)

To 3.36 g of the solution (the solid content is 19.5% by weight) of the reaction product corresponding to the above-mentioned formula (C-5) were added 0.13 g of 3,3',5,5'-tetrakis(methoxymethyl)-4,4'-dihydroxybiphenyl (product name: TMOM-BP, available from Honshu Chemical Industry Co., Ltd.) as a cross-linking agent, 0.01 g of pyridinium-4-hydroxybenzenesulfonate as a cross-linking catalyst, 0.001 g of a fluorine-based surfactant (product name: MEGAFACE R-40, available from DIC Corporation) as a surfactant, 14.58 g of propylene glycol monomethyl ether and 1.92 g of propylene glycol monomethyl ether acetate to prepare a solution of a protective film-forming composition.

[Resist Solvent Resistance Test]
Each of the protective film-forming compositions prepared in Examples 1 to 12 and Comparative Examples 1 to 5 was applied (spin-coat) on a silicon wafer by a spin coater. The composition-applied silicon wafer was heated on a hot plate at 250° C. for 1 minute to form an applied film (protective film) having a film thickness of 100 nm. Next, in order to confirm the resist solvent resistance of the protective film, the silicon wafer carrying the protective film thereon was immersed in a mixed solvent of propylene glycol monomethyl ether and propylene glycol monomethyl ether acetate having a weight-basis mixing ratio of 7:3 for 1 minute. After the immersion, the wafer was spin-dried and baked at 100° C. for 30 seconds. The film thicknesses of the protective film before and after the immersion in the mixed solvent were measured by an optical interference film thickness meter (product name: NanoSpec 6100, manufactured by Nanometrics Japan Ltd.).

The evaluation of the resist solvent resistance was carried out by calculating the percent film thickness reduction rate of the protective film removed by the immersion in the solvent according to the calculation formula: ((film thickness before immersion in solvent)−(film thickness after immersion in solvent))÷(film thickness before immersion in solvent)×100; and evaluating the calculated percent film thickness reduction rate. The results are shown in Table 1. Incidentally, if the film thickness reduction rate is about 1% or less, it can be said that the film has a sufficient resist solvent resistance.

TABLE 1

| No. | Film thickness reduction rate |
| --- | --- |
| Example 1 | 0.0% |
| Example 2 | 0.0% |
| Example 3 | 0.0% |
| Example 4 | 0.2% |
| Example 5 | 0.3% |
| Example 6 | 0.0% |
| Example 7 | 0.1% |
| Example 8 | 0.1% |
| Example 9 | 0.0% |
| Example 10 | 0.1% |
| Example 11 | −0.2% |
| Example 12 | 0.1% |
| Comparative Example 1 | 0.1% |
| Comparative Example 2 | 0.2% |
| Comparative Example 3 | 0.2% |
| Comparative Example 4 | 0.0% |
| Comparative Example 5 | 0.0% |

From the above results, the protective film-forming compositions of Examples 1 to 12 and Comparative Examples 1 to 5 had an extremely small change in film thickness even after being immersed in the resist solvent. Accordingly, the protective film-forming compositions of Examples 1 to 12 have a sufficient resist solvent resistance to function as a protective film.

[Resistance Test to Basic Aqueous Hydrogen Peroxide Solution]
For evaluating the resistance to a basic aqueous hydrogen peroxide solution, each of the protective film-forming compositions prepared in Examples 1 to 12 and Comparative Examples 1 to 5 was applied onto a TiN-deposited substrate having a deposit film thickness of 50 nm, and heated at 250° C. for 1 minute to form a protective film so as to have a film thickness of 100 nm. Next, 28% aqueous ammonia, 33% hydrogen peroxide and water were mixed in a weight-basis mixing ratio of 1:1:2, respectively, to prepare a basic aqueous hydrogen peroxide solution. The TiN-deposited substrate carrying the protective film-forming composition applied thereon was immersed into the basic aqueous hydrogen peroxide solution heated at 50° C., and the period (peeling time) from the time of immediately after the immersion to the time of peeling off of the protective film from the substrate was measured. The results of the resistance test to the basic aqueous hydrogen peroxide solution are shown in Table 2. Incidentally, it can be said that the longer the peeling time, the higher the resistance to the wet etching liquid using the basic aqueous hydrogen peroxide solution.

[Resistance Test to Acidic Aqueous Hydrogen Peroxide Solution]

For evaluating the resistance to an acidic aqueous hydrogen peroxide solution, each of the protective film-forming compositions prepared in Examples 1 to 12 and Comparative Examples 1 to 5 was applied onto a TiN-deposited substrate having a deposit film thickness of 50 nm, and heated at 250° C. for 1 minute to form a protective film so as to have a film thickness of 100 nm. Next, 85% phosphoric acid and water were mixed in a weight-basis mixing ratio of 1:1 to prepare an acidic aqueous hydrogen peroxide solution. The TiN-deposited substrate carrying the protective film-forming composition applied thereon was immersed into the acidic aqueous hydrogen peroxide solution heated at 60° C., and the period (peeling time) from the time of immediately after the immersion to the time of the peeling off of the protective film from the substrate was measured. The results of the resistance test to the acidic aqueous hydrogen peroxide solution are shown in Table 2. Incidentally, it can be said that the longer the peeling time, the higher the resistance to the wet etching liquid using the acidic aqueous hydrogen peroxide solution.

TABLE 2

| No. | Peeling time of protective film (basic aqueous hydrogen peroxide solution) | Peeling time of protective film (acidic aqueous hydrogen peroxide solution) |
| --- | --- | --- |
| Example 1 | 51 seconds | <5 minutes |
| Example 2 | 58 seconds | 5 to 10 minutes |
| Example 3 | 67 seconds | 5 to 10 minutes |
| Example 4 | 92 seconds | 5 to 10 minutes |
| Example 5 | 123 seconds | >10 minutes |
| Example 6 | 39 seconds | >10 minutes |
| Example 7 | 57 seconds | 5 to 10 minutes |
| Example 8 | 69 seconds | >10 minutes |
| Example 9 | 55 seconds | >10 minutes |
| Example 10 | 139 seconds | >10 minutes |
| Example 11 | 147 seconds | >10 minutes |
| Example 12 | 61 seconds | >10 minutes |
| Comparative Example 1 | 45 seconds | <5 minutes |
| Comparative Example 2 | 48 seconds | <5 minutes |
| Comparative Example 3 | 46 seconds | <5 minutes |

From the above-mentioned results, it was shown that Examples 1 to 5 and Examples 7 to 12 had a longer peeling time of the protective film to the basic hydrogen peroxide solution than Comparative Examples 1 to 3. That is, Examples 1 to 5 and Examples 7 to 12 have a good resistance to the wet etching liquid using the basic hydrogen peroxide solution than Comparative Examples 1 to 3.

Also, it was shown that Examples 2 to 12 had a longer peeling time of the protective film to the acidic aqueous hydrogen peroxide solution than Comparative Examples 1 to 3. That is, Examples 2 to 12 have a good chemical liquid resistance to the acidic aqueous hydrogen peroxide solution than Comparative Examples 1 to 3, and they have a resistance to the wet etching liquid using the acidic aqueous hydrogen peroxide solution.

Therefore, Examples 1 to 12 show a good chemical liquid resistance to the basic hydrogen peroxide solution or the acidic aqueous hydrogen peroxide solution or both of them than Comparative Examples 1 to 3, so that the composition of Examples 1 to 12 are useful as the protective film to the wet etching liquid for semiconductors.

Evaluation of Etching Selection Ratio

For evaluating the etching selection ratio, each of the protective film-forming compositions prepared in the above Examples 1 to 12 and Comparative Examples 4 to 5 was applied onto a silicon wafer and heated at 250° C. for 1 minute to form a protective film so as to have a film thickness of 100 nm. Next, the formed protective film and the resist underlayer film (product name: ARC (Registered Trademark) 29A, available from Nissan Chemical Corporation) for semiconductor lithography were subjected to dry etching with a nitrogen gas using a dry etching device (product name: RIE-10NR, manufactured by SUMCO CORPORATION) to determine the ratio of the dry etching rate (selection ratio of dry etching rate) of the protective film based on that of the resist underlayer film. The results of measurement of the etching selection ratio are shown in Table 3. Incidentally, it can be said that the larger the etching selection ratio, the faster the dry etching rate.

Flatness Test on Patterned Substrate

As a flatness test on a patterned substrate, each of the protective film-forming compositions prepared in Examples 1 to 12 and Comparative Examples 4 to 5 was applied onto a TiN-deposited, silicon substrate having a deposit film thickness of 5 nm and having a depth of 200 nm and a trench width of 50 nm. The resultant substrate was then heated at 250° C. for 1 minute. Incidentally, the protective film-forming composition was prepared so as to provide a film thickness of 100 nm after heated on the silicon wafer at 250° C. for 1 minute. After forming the protective film on the patterned substrate, the film thickness at a dense pattern area with a pitch of 100 nm and that at an open area having no pattern formed were observed by using a scanning electron microscope (product name: S-4800, manufactured by Hitachi High-Technologies Corporation), and the difference (film thickness bias) of the film thicknesses between the dense and the open area was determined. The results of determining the film thickness bias are shown in Table 3. Incidentally, it can be said that the smaller the film thickness bias, the smaller the difference in the film thicknesses between the dense area and the open area, so that the composition can be more flatly applied on a base substrate having a pattern.

TABLE 3

| No. | Etching selection ratio (ARC (registered trademark) 29A ratio) | Film thickness bias (dense/open) |
| --- | --- | --- |
| Example 1 | 1.08 | 54 nm |
| Example 2 | 1.01 | 22 nm |
| Example 3 | 0.91 | 32 nm |
| Example 4 | 1.00 | 14 nm |
| Example 5 | 0.88 | 42 nm |
| Example 6 | 0.94 | 58 nm |
| Example 7 | 0.90 | 18 nm |
| Example 8 | 0.83 | 30 nm |
| Example 9 | 0.88 | 46 nm |
| Example 10 | 0.89 | 40 nm |

TABLE 3-continued

| No. | Etching selection ratio (ARC (registered trademark) 29A ratio) | Film thickness bias (dense/open) |
|---|---|---|
| Example 11 | 0.80 | 48 nm |
| Example 12 | 0.86 | 60 nm |
| Comparative Example 4 | 0.65 | 81 nm |
| Comparative Example 5 | 0.78 | 81 nm |

From the above results, it can be said that Examples 1 to 12 have a higher dry etching selection ratio than Comparative Examples 4 to 5, so that the composition of Examples 1 to 12 have a rapid dry etching rate. That is, Examples 1 to 12 may shorten the dry etching time necessary for removing the protective film, and reduce damage to the base substrate, so that the compositions of Examples 1 to 12 are useful.

In addition, in Examples 1 to 12, the difference in film thicknesses (film thickness bias) between the dense area and the open area is smaller than in Comparative Examples 4 to 5, so that it can be said that the compositions of Examples 1 to 12 can be more flatly applied on a base substrate having a pattern. That is, Examples 1 to 12 are unlikely to cause unevenness of the film thickness on a base substrate having a pattern, and permit uniform removal of a certain amount of the protective film in a desired etching time, so that the compositions of Examples 1 to 12 are useful.

That is, Example 1 to Example 12 are excellent in resistance to a wet etching liquid for semiconductors using a basic aqueous hydrogen peroxide solution or an acidic aqueous hydrogen peroxide solution than Comparative Examples 1 to 3, and are rapid in etching rate than Comparative Examples 4 to 5, so that the compositions of Examples 1 to 12 can be flatly applied on a base substrate having a pattern. Therefore, according to the present invention, there is provided a protective film-forming composition having a high wet etching resistance, high etching rate, and high flatness in combination.

INDUSTRIAL APPLICABILITY

The protective film-forming composition according to the present invention is excellent in resistance to wet etching liquids applied for processing a substrate, and has a high dry etching rate, so that the composition permits easy processing of a substrate; and the composition provides a protective film excellent in flatness, when it is applied to a stepped substrate.

The invention claimed is:

1. A protective film-forming composition to a wet etching liquid for semiconductors, the protective film-forming composition comprising a solvent and a ring-opening polymerization product (C) from a reaction of a diepoxy compound (A) and a bi- or higher functional proton-generating compound (B), wherein the ring-opening polymerization product (C) is represented by a unit structure of the following formula (A-1):

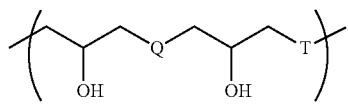

Formula(A-1)

wherein, in formula (A-1):
T represents a divalent organic group derived from the bi- or higher functional proton-generating compound (B), and
Q represents a divalent organic group from the ring-opening polymerization of the diepoxy compound (A), and Q is represented by the following formula (A-2):

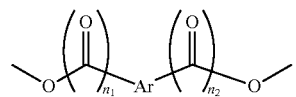

Formula(A-2)

wherein, in formula (A-2), Ar represents a divalent arylene group, and $n_1$ and $n_2$ each independently represent an integer of 0 or 1.

2. The protective film-forming composition according to claim 1, wherein Ar in formula (A-2) is represented by any of the following formula (A-3), the following formula (A-4) and the following formula (A-5):

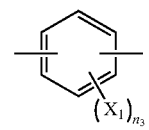

Formula(A-3)

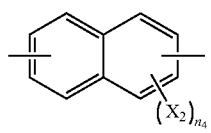

Formula(A-4)

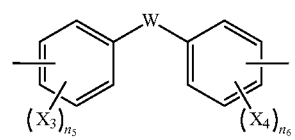

Formula(A-5)

wherein, in formula (A-3) to formula (A-5), $X_1$, $X_2$, $X_3$ and $X_4$ each independently represent an alkyl group having 1 to 6 carbon atoms; —W— represents any of a direct bond, —CH$_2$—, —C(CH$_3$)$_2$—, —C(CF$_3$)$_2$—, —CO—, —O—, —S— or —SO$_2$—; $n_3$, $n_5$ and $n_6$ each independently represent an integer of 0 to 4; and $n_4$ represents an integer of 0 to 6.

3. A protective film-forming composition to a wet etching liquid for semiconductors, the protective film-forming composition comprising a solvent and a ring-opening polymerization product (C) from a reaction of a diepoxy compound (A) and a bi- or higher functional proton-generating compound (B), wherein the ring-opening polymerization product (C) is represented by a unit structure of the following formula (A-1):

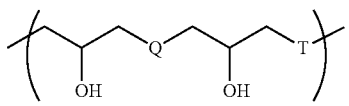

Formula(A-1)

wherein, in formula (A-1):
Q represents a divalent organic group from the ring-opening polymerization of the diepoxy compound (A), and
T represents a divalent organic group derived from the bi- or higher functional proton-generating compound (B), and T is represented by the following formula (A-6) or the following formula (A-7):

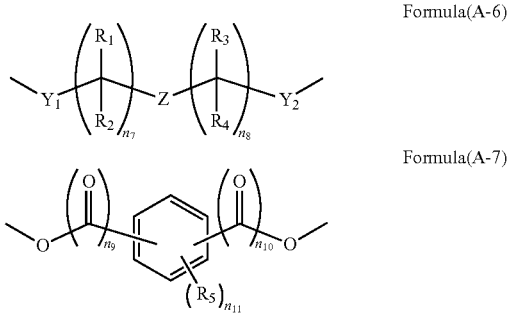

Formula(A-6)

Formula(A-7)

wherein, in formula (A-6) or formula (A-7):
$R_1$, $R_2$, $R_3$, $R_4$ and $R_5$ each independently represent a hydrogen atom, an alkyl group having 1 to 6 carbon atoms optionally substituted, an alkenyl group having 2 to 6 carbon atoms, a hydroxy group, an alkoxy group having 1 to 6 carbon atoms, a cyano group or a halogen atom, and $R_2$ and $R_4$ optionally bonded to each other to form a ring;
—$Y_1$— and —$Y_2$— each independently represent —O—, —S—, —OCO— or —COO—;
Z represents a direct bond or a divalent organic group;
$n_7$ and $n_8$ each independently represent an integer of 0 to 5;
$n_9$ and $n_{10}$ each independently represent an integer of 0 or 1; and
$n_{11}$ represents an integer of 0 to 4.

4. The protective film-forming composition according to claim 3, wherein the divalent organic group represented by Z in formula (A-6) is represented by the following formula (A-8):

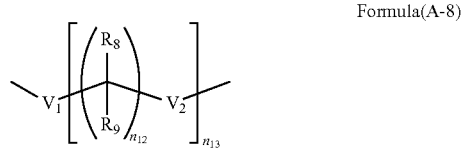

Formula(A-8)

wherein, in formula (A-8), —V1— represents —O—, —S—, —S—S—, —$CR_{10}$=$CR_{11}$—, —C(=$CR_{12}R_{13}$)— or —C≡C—; $R_{10}$, $R_{11}$, $R_{12}$ and $R_{13}$ each independently represent a hydrogen atom or a methyl group: —$V_2$— represents —O— or —S—; $R_8$ and $R_9$ each independently represent a hydrogen atom, an alkyl group having 1 to 6 carbon atoms optionally substituted, an alkenyl group having 2 to 6 carbon atoms, a hydroxy group, an alkoxy group having 1 to 6 carbon atoms, a cyano group or a halogen atom; $n_{12}$ represents an integer of 1 to 3; and $n_{13}$ represents an integer of 0 to 2.

5. The protective film-forming composition according to claim 2, wherein Ar in formula (A-2) is represented by formula (A-3).

6. The protective film-forming composition according to claim 5, wherein $n_3$ in formula (A-3) is 0.

7. The protective film-forming composition according to claim 3, wherein —T— in formula (A-1) is represented by formula (A-6).

8. The protective film-forming composition according to claim 7, wherein —$Y_1$— and —$Y_2$— in formula (A-6) are —COO—.

9. The protective film-forming composition according to claim 1, which further comprises a cross-linking catalyst.

10. The protective film-forming composition according to claim 1, which further comprises a cross-linking agent.

11. The protective film-forming composition according to claim 1, which further comprises a surfactant.

12. A protective film which comprises a baked product of an applied film comprising the protective film-forming composition according to claim 1.

13. A method for producing a substrate equipped with a resist pattern being used for manufacturing a semiconductor, which comprises the steps of:
applying the protective film-forming composition according to claim 1 on a semiconductor substrate and baking the applied composition to form a protective film as a resist underlayer film, and
forming a resist film on the protective film, followed by subjecting the resist and protective films to exposure and development to form a resist pattern.

14. A method for manufacturing a semiconductor device which comprises the steps of:
forming a protective film on a semiconductor substrate optionally carrying an inorganic film formed thereon with the protective film-forming composition according to claim 1,
forming a resist pattern on the protective film,
dry etching the protective film using the resist pattern as a mask to expose a surface of the inorganic film or the semiconductor substrate, and
wet etching the inorganic film or the semiconductor substrate with a wet etching liquid for semiconductors using the dry-etched protective film as a mask, followed by washing the wet-etched inorganic film and substrate.

15. The protective film-forming composition according to claim 3, which further comprises a cross-linking catalyst.

16. The protective film-forming composition according to claim 3, which further comprises a cross-linking agent.

17. The protective film-forming composition according to claim 3, which further comprises a surfactant.

18. A protective film which comprises a baked product of an applied film comprising the protective film-forming composition according to claim 3.

19. A method for producing a substrate equipped with a resist pattern being used for manufacturing a semiconductor, which comprises the steps of:
applying the protective film-forming composition according to claim 3 on a semiconductor substrate and baking the applied composition to form a protective film as a resist underlayer film, and
forming a resist film on the protective film, followed by subjecting the resist and protective films to exposure and development to form a resist pattern.

20. A method for manufacturing a semiconductor device which comprises the steps of:
forming a protective film on a semiconductor substrate optionally carrying an inorganic film formed thereon with the protective film-forming composition according to claim 3, forming a resist pattern on the protective film,
dry etching the protective film using the resist pattern as a mask to expose a surface of the inorganic film or the semiconductor substrate, and
wet etching the inorganic film or the semiconductor substrate with a wet etching liquid for semiconductors using the dry-etched protective film as a mask, followed by washing the wet-etched inorganic film and substrate.

* * * * *